United States Patent
Kumaki et al.

(10) Patent No.: US 8,455,114 B2
(45) Date of Patent: *Jun. 4, 2013

(54) LIGHT EMITTING ELEMENT AND LIGHT EMITTING DEVICE USING THE SAME

(75) Inventors: Daisuke Kumaki, Nigata (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/525,565

(22) Filed: Jun. 18, 2012

(65) Prior Publication Data

US 2012/0280266 A1    Nov. 8, 2012

Related U.S. Application Data

(63) Continuation of application No. 10/587,010, filed as application No. PCT/JP2005/020687 on Nov. 4, 2005, now Pat. No. 8,202,630.

(30) Foreign Application Priority Data

Nov. 5, 2004  (JP) .................................. 2004-322996
Nov. 26, 2004  (JP) .................................. 2004-342323

(51) Int. Cl.
*H01L 51/54*    (2006.01)

(52) U.S. Cl.
USPC ............ 428/690; 428/917; 313/504; 313/506

(58) Field of Classification Search
None
See application file for complete search history.

(56) References Cited

U.S. PATENT DOCUMENTS 5,093,698 A    3/1992    Egusa
6,013,384 A    1/2000    Kido et al.

(Continued)

FOREIGN PATENT DOCUMENTS

EP    0 855 848 A2    7/1998
EP    0 891 121 A1    1/1999

(Continued)

OTHER PUBLICATIONS

Thomas, K.R.J. et al, "Quinoxalines Incorporating Triarylamines: Potential Electroluminescent Materials with Tunable Emission Characteristics," Chemistry of Materials, vol. 14, No. 6, 2002, pp. 2796-2802.

(Continued)

*Primary Examiner* — Dawn Garrett
(74) *Attorney, Agent, or Firm* — Husch Blackwell LLP

(57) ABSTRACT

An object of the present invention is to provide a light emitting element having slight increase in driving voltage with accumulation of light emitting time. Another object of the invention is to provide a light emitting element having slight increase in resistance with increase in film thickness. In an aspect of the invention, a light emitting element includes a first layer, a second layer and a third layer between mutually-facing first and second electrodes. The first layer is provided to be closer to the first electrode than the second layer. The third layer is provided to be closer to the second electrode than the second layer. The first layer contains a bipolar substance and a substance exhibiting an electron accepting ability with respect to the bipolar substance. The second layer contains a bipolar substance and a substance exhibiting an electron donating ability with respect to the bipolar substance. The third layer contains a light emitting substance.

22 Claims, 13 Drawing Sheets

U.S. PATENT DOCUMENTS

| | | | |
|---|---|---|---|
| 6,150,043 | A | 11/2000 | Thompson et al. |
| 6,191,764 | B1 | 2/2001 | Kono et al. |
| 6,344,283 | B1 | 2/2002 | Inoue et al. |
| 6,623,872 | B2 | 9/2003 | Inoue et al. |
| 6,717,358 | B1 | 4/2004 | Liao et al. |
| 6,991,859 | B2 | 1/2006 | Klubek et al. |
| 7,420,203 | B2 | 9/2008 | Tsutsui et al. |
| 7,473,923 | B2 | 1/2009 | Tsutsui et al. |
| 7,564,052 | B2 | 7/2009 | Kumaki et al. |
| 7,598,670 | B2 | 10/2009 | Kumaki et al. |
| 7,750,560 | B2 * | 7/2010 | Yamazaki et al. ............ 313/506 |
| 7,893,427 | B2 | 2/2011 | Kumaki et al. |
| 8,174,178 | B2 * | 5/2012 | Abe et al. ............ 313/499 |
| 8,202,630 | B2 * | 6/2012 | Kumaki et al. ............ 428/690 |
| 8,227,982 | B2 * | 7/2012 | Iwaki et al. ............ 313/509 |
| 2002/0102434 | A1 | 8/2002 | Inoue et al. |
| 2003/0127967 | A1 | 7/2003 | Tsutsui et al. |
| 2003/0143430 | A1 | 7/2003 | Kawamura et al. |
| 2003/0189401 | A1 | 10/2003 | Kido et al. |
| 2003/0224202 | A1 | 12/2003 | Brown et al. |
| 2004/0110030 | A1 | 6/2004 | Inoue et al. |
| 2005/0098207 | A1 | 5/2005 | Matsumoto et al. |
| 2005/0186446 | A1 | 8/2005 | Shitagaki et al. |
| 2006/0008740 | A1 | 1/2006 | Kido et al. |
| 2008/0252199 | A1 | 10/2008 | Yamazaki et al. |
| 2009/0045738 | A1 | 2/2009 | Tsutsui et al. |

FOREIGN PATENT DOCUMENTS

| | | | |
|---|---|---|---|
| EP | 1 029 909 | A1 | 8/2000 |
| EP | 1 318 553 | A2 | 6/2003 |
| EP | 1 351 558 | A1 | 10/2003 |
| EP | 1 408 563 | A2 | 4/2004 |
| EP | 1 530 245 | A2 | 5/2005 |
| EP | 1 616 864 | A1 | 1/2006 |
| EP | 1 617 493 | A2 | 1/2006 |
| EP | 1 919 008 | A2 | 5/2008 |
| JP | 10-270171 | | 10/1998 |
| JP | 10-270172 | | 10/1998 |
| JP | 10-288965 | | 10/1998 |
| JP | 11-307264 | | 11/1999 |
| JP | 2000-309566 | | 11/2000 |
| JP | 2003-264085 | | 9/2003 |
| JP | 2003-272860 | | 9/2003 |
| JP | 2004-281371 | | 10/2004 |
| JP | 2004-281409 | | 10/2004 |
| JP | 2005-166637 | | 6/2005 |
| JP | 2006-24791 | | 1/2006 |
| WO | WO 98/30071 | A1 | 7/1998 |
| WO | WO 00/014174 | A1 | 3/2000 |
| WO | WO 2004/094389 | A1 | 11/2004 |

OTHER PUBLICATIONS

International Search Report re application No. PCT/JP2005/020687, dated Feb. 21, 2006.

Written Opinion re application No. PCT/JP2005/020687, dated Feb. 21, 2006.

* cited by examiner

LIGHT EMITTING ELEMENT AND LIGHT EMITTING DEVICE USING THE SAME

This application is a continuation of pending application Ser. No. 10/587,010 filed on Jul. 21, 2006 now U.S. Pat. No. 8,202,630 which is the U.S. National Stage of PCT/JP2005/020687 filed Nov. 4, 2005.

TECHNICAL FIELD

The present invention relates to a light emitting element including a light emitting substance between a pair of electrodes, and in particular, relates to the structure of the light emitting element.

BACKGROUND ART

In recent years, many of light emitting elements used for a display device and the like have a structure in that a light emitting substance is interposed between a pair of electrodes. In a light emitting element having such a structure, when returning an exciton that is formed by recombination of an electron injected from one electrode and a hole injected from the other electrode to a ground state, light is emitted.

Many of these light emitting elements have a problem that the driving voltage is increased in accordance with the accumulation of light emitting time.

As one example for solving this problem, for example, the patent document 1 discloses an organic EL element, wherein increase in the driving voltage in driving the organic EL element and the like is suppressed by utilizing a compound that has a certain structure for the organic EL element.

[Patent Document 1]: Japanese Patent Publication No. 98-30071

DISCLOSURE OF INVENTION

It is one object of the present invention to provide a light emitting element having a slight increase in driving voltage with the accumulation of light emitting time. It is another object of the invention to provide a light emitting element having a slight increase in resistance with the increase in film thickness.

In an aspect of the invention, a light emitting element includes a first layer, a second layer, and a third layer between mutually-facing first and second electrodes. The first, second and third layers are sequentially laminated such that the second layer is interposed between the first and third layers. The first layer is in contact with the first electrode while the third layer is in contact with the second electrode. The first layer generates holes. The second layer generates electrons. The third layer contains a light emitting substance. The second layer and the third layer are connected to each other so as to inject electrons generated in the second layer into the third layer when applying the voltage to the light emitting element such that a potential of the second electrode is higher than that of the first electrode. This allows the light emitting element to emit light.

In another aspect of the invention, a light emitting element includes a first layer, a second layer, and a third layer between mutually-facing first and second electrodes. The first, second and third layers are sequentially laminated such that the second layer is interposed between the first and third layers. The first layer is in contact with the first electrode while the third layer is in contact with the second electrode. The first layer contains a bipolar substance and a substance exhibiting an electron accepting ability with respect to the bipolar substance. The second layer contains a bipolar substance and a substance exhibiting an electron donating ability with respect to the bipolar substance. The third layer contains a light emitting substance. The second layer and the third layer are connected to each other so as to inject electrons generated in the second layer into the third layer when applying the voltage to the light emitting element such that a potential of the second electrode is higher than that of the first electrode. This allows the light emitting element to emit light.

In another aspect of the invention, a light emitting element includes a first layer, a second layer, and a third layer between mutually-facing first and second electrodes. The first layer is provided to be closer to the first electrode than the second layer and the third layer is provided to be closer to the second electrode than the second layer. The first layer generates holes. The second layer generates electrons. The third layer contains a light emitting substance. The second layer and the third layer are connected to each other so as to inject electrons generated in the second layer into the third layer when applying the voltage to the light emitting element such that a potential of the second electrode is higher than that of the first electrode. This allows the light emitting element to emit light.

In another aspect of the invention, a light emitting element includes a first layer, a second layer, and a third layer between mutually-facing first and second electrodes. The first layer is provided to be closer to the first electrode than the second layer and the third layer is provided to be closer to the second electrode than the second layer. The first layer contains a bipolar substance and a substance exhibiting an electron accepting ability with respect to the bipolar substance. The second layer contains a bipolar substance and a substance exhibiting an electron donating ability with respect to the bipolar substance. The third layer contains a light emitting substance. The second layer and the third layer are connected to each other so as to inject electrons generated in the second layer into the third layer when applying the voltage to the light emitting element such that a potential of the second electrode is higher than that of the first electrode. This allows the light emitting element to emit light.

In another aspect of the invention, a light emitting element includes a layer containing a bipolar substance and a layer containing a light emitting substance between mutually-facing first and second electrodes. The layer containing the bipolar substance is in contact with the first electrode while the layer containing the light emitting substance is in contact with the second electrode. The layer containing the bipolar substance has a first region and a second region, wherein the first region includes a layer containing a bipolar substance and a substance exhibiting an electron accepting ability with respect to the bipolar substance, and the second region includes a layer containing a bipolar substance and a substance exhibiting an electron donating ability with respect to the bipolar substance. The first region is provided to be closer to the first electrode than the second region. The layer containing the bipolar substance and the layer containing the light emitting substance are connected to each other so as to inject electrons generated in the second region into the layer containing the light emitting substance when applying the voltage to the light emitting element such that a potential of the second electrode is higher than that of the first electrode. This allows the light emitting element to emit light.

In another aspect of the invention, a light emitting element includes a layer containing a bipolar substance and a layer containing a light emitting substance between mutually-facing first and second electrodes. The layer containing the bipolar substance is provided to be closer to the first electrode than the layer containing the light emitting substance. The layer containing the bipolar substance has a first region and a second region, wherein the first region includes a layer containing a bipolar substance and a substance exhibiting an electron accepting ability with respect to the bipolar substance, and the second region includes a layer containing a bipolar substance and a substance exhibiting an electron donating ability with respect to the bipolar substance. The first region is provided to be closer to the first electrode than the second region. The layer containing the bipolar substance and the layer containing the light emitting substance are connected to each other so as to inject electrons generated in the second region into the layer containing the light emitting substance when applying the voltage to the light emitting element such that a potential of the second electrode is higher than that of the first electrode. This allows the light emitting element to emit light.

In another aspect of the invention, a light emitting element includes a first layer, a second layer, and a third layer between mutually-facing first and second electrodes. The first, second and third layers are sequentially laminated such that the second layer is interposed between the first and third layers. The first layer contains a bipolar substance and a substance exhibiting an electron donating ability with respect to the bipolar substance. The second layer contains a bipolar substance and a substance exhibiting an electron donating ability with respect to the bipolar substance. The third layer has x pieces of layers (x is a given positive integer) including a light emitting layer. One layer included in the third layer is in contact with the second layer and the x-th layer included in the third layer is in contact with the second electrode. The first electrode includes a conductive material having high reflectance. There are y pieces of layers (y<x, wherein y is a positive integer) between the light emitting layer of the third layer and the second layer. The second layer and the one layer of the third layer are connected to each other so as to inject electrons generated in the second layer into the one layer of the third layer when applying the voltage to the light emitting element such that a potential of the second electrode is higher than that of the first electrode. This allows the light emitting element to emit light. The thicknesses of the first and second layers are adjusted so as to satisfy the following expressions 1, 2 and 3:

$$n_i d_i + n_{ii} d_{ii} + \sum_{k=1}^{y} n_k d_k + n_j d_j = \frac{(2m-1)\lambda}{4} \quad 1$$

$$0 \leq d_j \leq d_{emi} \quad 2$$

$$d_i \geq d_{ii} \quad 3$$

In the expressions 1, 2 and 3, $n_i$ represents a refractive index of the first layer; $d_i$, a thickness of the first layer; $n_{ii}$ a refractive index of the second layer; $d_{ii}$, a thickness of the second layer; $n_k$, a refractive index of a k-th layer (k is a natural number) of the layers between the light emitting layer and the second layer; $d_k$, a thickness of the k-th layer of the layers between the light emitting layer and the second layer; $n_j$, a refractive index of the light emitting layer; $d_j$, a distance from an interface between the light emitting layer and the first electrode to a light emitting region; λ, a wavelength of light emission from the light emitting elements; m, a given positive integer; and $d_{emi}$, a thickness of the light emitting layer.

A highly reliable light emitting element having slight increase in driving voltage with the accumulation of light emitting time can be obtained in accordance with the present invention.

In addition, a light emitting element having slight increase in resistance that is dependent on the thickness of a layer generating holes can be obtained. As a result, a light emitting element in that a distance between electrodes can be easily changed can be obtained. By increasing the distance between the electrodes, the short-circuiting between the electrodes caused by the unevenness on the surfaces of the electrodes can be prevented. Also, by adjusting the distance between the electrodes, an optical distance can be easily adjusted so as to maximize an light extraction efficiency easily. Furthermore, by adjusting the distance between the electrodes, the optical distance can be controlled easily so that the variation in emission spectrum depending on an angle of seeing a light emitting surface is reduced.

Furthermore, by applying the light emitting element obtained in accordance with the present invention to a light emitting device, a highly reliable light emitting device that can withstand long-time use can be obtained. Moreover, by applying the light emitting element obtained in accordance with the present invention to a light emitting device having a display function, it is possible to obtain a light emitting device capable of displaying high-definition images with slight variation in the emission spectrum that depends on an angle of seeing a light emitting surface, wherein light can be emitted to the outside efficiently.

BEST MODE FOR CARRYING OUT THE INVENTION

The embodiment modes according to the present invention will hereinafter be described. It is easily understood by those who skilled in the art that the embodiment modes and details herein disclosed can be modified in various ways without departing from the purpose and the scope of the invention. The present invention should not be interpreted as being limited to the description of the embodiment modes to be given below.

Embodiment Mode 1

Figure 1:
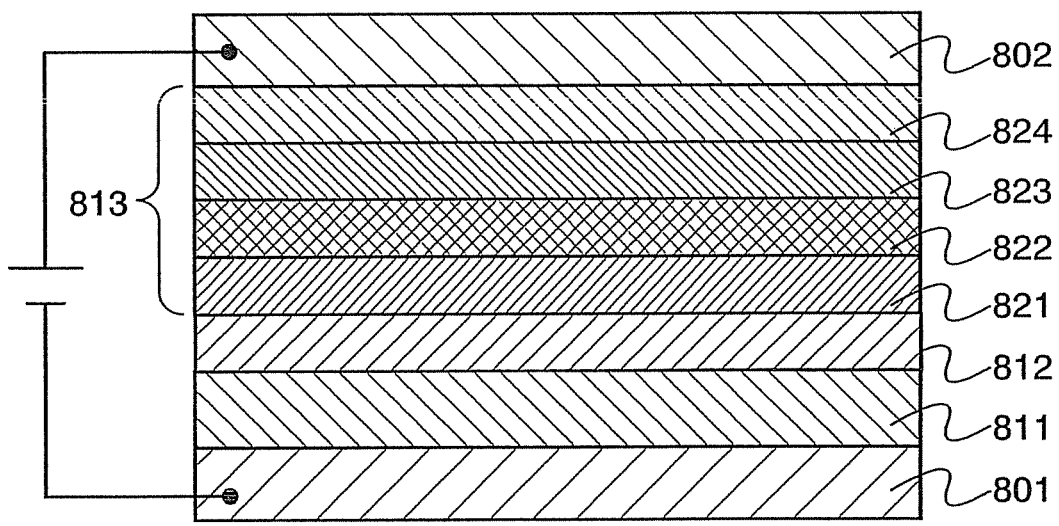
FIG. 1 is a cross sectional view showing an example of a laminated structure of a light emitting element in accordance with the present invention.

One embodiment mode of the present invention will be described with reference to a cross sectional view of a light emitting element as shown in FIG. 1.

A first layer 811, a second layer 812, and a third layer 813 are interposed between a first electrode 801 and a second electrode 802. The first layer 811, the second layer 812 and the third layer 813 are sequentially laminated. The first layer 811 is in contact with the first electrode 801 while the third layer 813 is in contact with the second electrode 802.

The light emitting element of the present embodiment mode is operated as follows. Upon applying a voltage to the light emitting element such that a potential of the second electrode 802 is higher than that of the first electrode 801, holes are injected in the first electrode 801 from the first layer 811 while electrons are injected in the third layer 813 from the second layer 812. Also, holes are injected in the third layer 813 from the second electrode 802. The holes injected from the second electrode 802 and the electrons injected from the second layer 812 are recombined in the third layer 813 so that a light emitting substance is excited. The light emitting substance emits light when returning to a ground state from the excited state.

The above mentioned structure makes it possible to obtain a light emitting element having slight variation in voltage applied for flowing a predetermined amount of current that is dependent on a thickness of a layer generating holes (i.e., the first layer 811).

The respective layers, the electrodes, and the like will be described in detail below.

The first layer 811 generates the holes. As a layer for generating the holes, for example, a layer containing a bipolar substance and a substance exhibiting an electron accepting ability with respect to the bipolar substance can be used. The bipolar substance is a substance in that when comparing an electron mobility with a hole mobility of the bipolar substance, the ratio of the electron mobility to the hole mobility is 100 or less (preferably, 10 or less), or the ratio of the hole mobility to the electron mobility is 100 or less (preferably, 10 or less). That is, the bipolar substance is a substance in that when comparing a carrier mobility of any one of an electron and a hole with a carrier mobility of the other one, the ratio of the carrier mobility of any one of the electron and the hole to the carrier mobility of the other one is 100 or less, and more preferably, 10 or less. As the bipolar substance, for instance, 2,3-bis(4-diphenylaminophenyl)quinoxaline (abbreviation: TPAQn) that is expressed by the structural formula 1; 2,3-bis{4-[N-(1-naphthyl)-N-phenylamino]phenyl}-dibenzo[f,h]quinoxaline (abbreviation: NPADiBzQn) that is expressed by the structural formula 2; 2,2',3,3'-tetrakis(4-diphenylaminophenyl)-6,6'-bisquinoxaline (abbreviation: D-TriPhAQn) that is expressed by the structural formula 3; and the like can be given. Other substances can be used.

[Structural Formula 1]

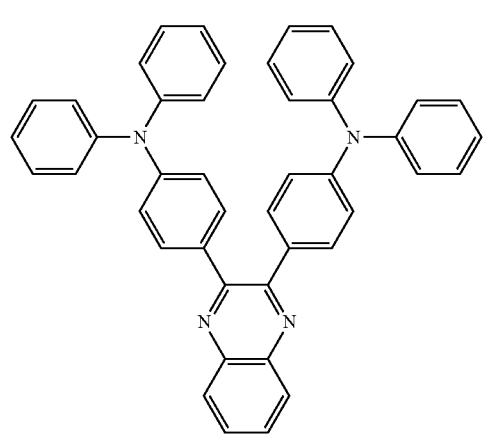

(1)

[Structural Formula 2]

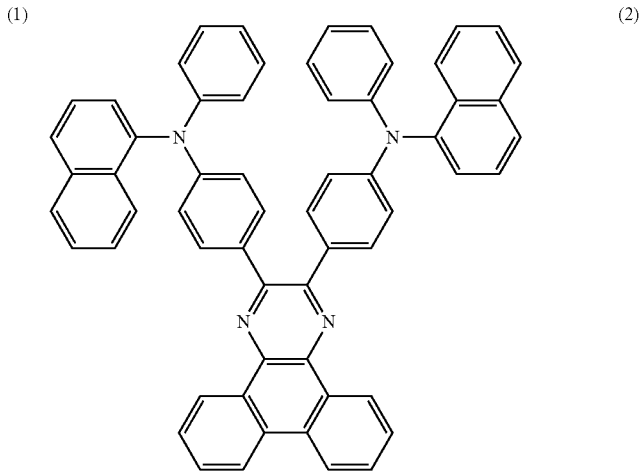

(2)

[Structural Formula 3]

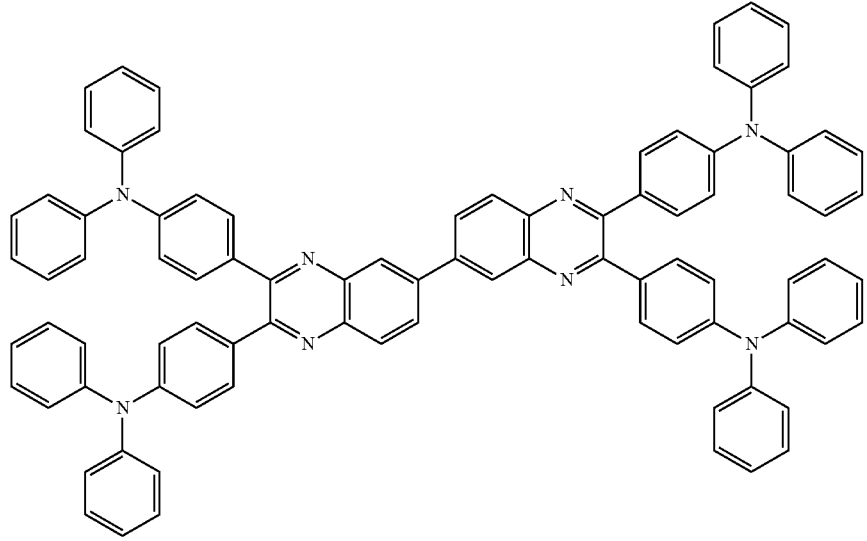

(3)

Also, among the bipolar substances, a substance that contains triphenylamine in its skeleton is preferably used. This allows to generate the holes easily. More preferably, a bipolar substance having a hole mobility and an electron mobility of $1 \times 10^{-6}$ cm$_2$/Vs or more is used. Meanwhile, the substance exhibiting the electron accepting ability with respect to the bipolar substance is not particularly limited. For example, molybdenum oxide, vanadium oxide, rhenium oxide, 7,7,8,8-tetracyanoquinodimethane (abbreviation: TCNQ), 2,3,5,6-tetrafluoro-7,7,8,8-tetracyanoquinodimethane (abbreviation: F4-TCNQ), and the like can be used. The layer generating the holes preferably contains the substance exhibiting the electron accepting ability with respect to the bipolar substance such that the molar ratio of the substance exhibiting the electron accepting ability with respect to the bipolar substance (i.e., the substance exhibiting the electron accepting ability with respect to the bipolar substance/the bipolar substance) is 0.5 or more and 2 or less.

The second layer 812 generates electrons. As a layer generating the electrons, for example, a layer that contains a bipolar substance and a substance exhibiting an electron accepting ability with respect to the bipolar substance can be used. As the bipolar substance, the above mentioned TPAQn, NPADiBzQn, D-TriPhAQn, and the like can be employed. In addition, other substances can be used. Also, a substance that contains heteroaromatic ring in its skeleton is preferably used among the bipolar substances. More preferably, a bipolar substance that has a hole mobility and an electron mobility of $1 \times 10^{-6}$ cm$^2$/Vs or more is used. The substance exhibiting the electron donating ability with respect to the bipolar substance is not particularly limited. For example, alkali metal such as lithium and cesium, alkali earth metal such as magnesium and calcium, rare earth metal such as erbium and ytterbium, and the like can be used. Further, alkali metal oxide or alkali earth metal oxide such as lithium oxide (Li$_2$O), calcium oxide (CaO), sodium oxide (Na$_2$O), kalium oxide (K$_2$O) and magnesium oxide (MgO) may be used as the substance exhibiting the electron donating ability with respect to the bipolar substance. Furthermore, since the alkali metal oxide, the alkali earth metal oxide, and the like have low reactivity, they can be used easily. The layer generating the electrons preferably contains a substance exhibiting an electron donating ability with respect to the bipolar substance such that the molar ratio of the substance exhibiting the electron donating ability to the bipolar substance (i.e., the substance exhibiting the electron donating ability with respect to the bipolar substance/the bipolar substance) is 0.5 or more and 2 or less.

Further, the bipolar substance included in the first layer 811 and the bipolar substance included in the second layer 812 may be different from each other or identical to each other. When the first layer 811 and the second layer 812 are formed using the same bipolar substance, a quinoxaline derivative that has triphenylamine and heteroaromatic ring in its skeleton as expressed by the general formula 1 or the general formula 2 is preferably used. As a specific example of the quinoxaline derivative, TPAQn, NPADiBzQn, D-TriPhAQn, and the like can be given. When the first layer 811 and the second layer 812 contain the same bipolar substance, the first and second layers 811 and 812 can be successively formed, making it possible to save a manufacturing effort.

[General Formula 1]

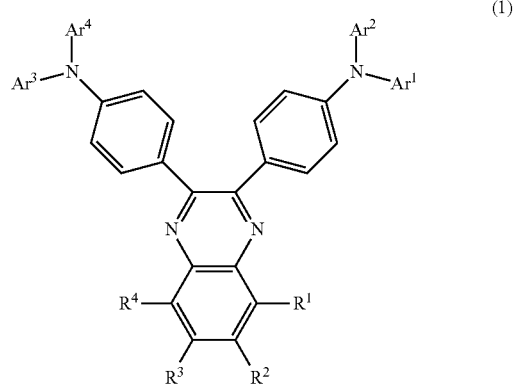

(1)

In the general formula 1, $R^1$ to $R^4$ each independently represent any of hydrogen and an alkyl group. The $R^1$ and $R^2$, the $R^2$ and $R^3$, or the $R^3$ and $R^4$ may be bonded to each other, respectively, to form aromatic rings. Further, $Ar^1$ to $Ar^4$ each independently represent an aryl group having 6 to 14 carbon atoms.

[General Formula 2]

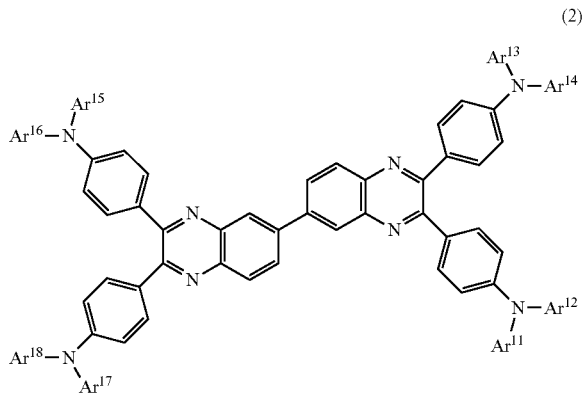

(2)

In the general formula 2, $Ar^{11}$ to $Ar^{18}$ each independently represent an aryl group having 6 to 14 carbon atoms.

The third layer 813 includes a light emitting layer. The structure of the third layer 813 is not particularly limited, and the third layer may include either a single layer or a plurality of layers. For example, as shown in FIG. 1, the third layer 813 may include an electron transporting layer 821, a hole transporting layer 823 and a hole injecting layer 824 together with a light emitting layer 822. Alternatively, the third layer may includes only the light emitting layer.

The light emitting layer 822 contains a light emitting substance. The light emitting substance herein indicates a substance with excellent light emitting efficiency that can emit light with a predetermined emission wavelength. Although the third layer 813 is not particularly limited, the third layer is preferably one in that a light emitting substance is dispersed in a layer made from a substance having a larger energy gap than that of the light emitting substance. This layer can prevent light emitted from the light emitting substance from going out due to the concentration of the light emitting substance. Further, the energy gap indicates an energy gap between the LUMO level and the HOMO level.

The light emitting substance is not particularly limited. A substance having the excellent light emission efficiency that can emit light with a predetermined emission wavelength may be used. In order to emit red light, for example, the following substances exhibiting emission spectrum with peaks at 600 to 680 nm can be employed:
4-dicyanomethylene-2-isopropyl-6-[2-(1,1,7,7-tetramethyl-julolidine-9-yl)ethenyl]-4H-pyran (abbreviation: DCJTI);
4-dicyanomethylene-2-methyl-6-[2-(1,1,7,7-tetramethyljulolidine-9-yl)ethenyl]-4H-pyran (abbreviation: DCJT);
4-dicyanomethylene-2-tert-butyl-6-[2-(1,1,7,7-tetramethyljulolidine-9-yl)ethenyl]-4H-pyran (abbreviation: DCJTB); periflanthene;
2,5-dicyano-1,4-bis[2-(10-methoxy-1,1,7,7-tetramethyljulolidine-9-yl)ethenyl]benzene;
and the like. In order to obtain green light emission, substances exhibiting emission spectrum with peaks at 500 to 550 nm such as N,N'-dimethylquinacridon (abbreviation: DMQd), coumarin 6, coumarin 545T, and tris(8-quinolinolate)aluminum (abbreviation: $Alq_3$) can be employed. In order to obtain blue light emission, the following substances exhibiting emission spectrum with peaks at 420 to 500 nm can be employed: 9,10-bis(2-naphthyl)-tert-butylanthracene (abbreviation: t-BuDNA); 9,9'-bianthryl; 9,10-diphenylanthracene (abbreviation: DPA); 9,10-bis(2-naphthyl)anthracene (abbreviation: DNA); bis(2-methyl-8-quinolinolate)-4-phenylphenolate-gallium (abbreviation: BGaq); bis(2-methyl-8-quinolinolate)-4-phenylphenolate-aluminum (abbreviation: BAlq); and the like. In addition to the above mentioned fluorescing substances, following phosphorescent substances can be used as the light emitting substances: bis[2-(3,5-bis(trifluoromethyl)phenyl)pyridinato-N,$C^{2'}$]iridium (III) picolinate (abbreviation: Ir($CF_3$ppy)$_2$(pic)); bis[2-(4,6-difluorophenyl)pyridinato-N,$C^{2'}$]iridium (III) acetylacetonate (abbreviation: FIr(acac)); bis[2-(4,6-difluorophenyl)pyridinato-N, $C^{2'}$]iridium (III) picolinate (FIr(pic)); tris(2-phenylpyridinato-N, $C^{2'}$) iridium (abbreviation: Ir(ppy)$_3$); and the like.

A substance used for dispersing a light emitting substance is not particularly limited. For example, an anthracene derivative such as 9,10-di(2-naphthyl)-2-tert-butylanthracene (abbreviation: t-BuDNA), a carbazole derivative such as 4,4'-bis(N-carbazolyl)biphenyl (abbreviation: CBP), a metal complex such as bis[2-(2-hydroxyphenyl)pyridinato]zinc (abbreviation: Znpp$_2$) and bis[2-(2-hydroxyphenyl)benzoxazolato]zinc (abbreviation: Zn(BOX)$_2$), and the like can be used.

In the above-described light emitting element, the difference in electron affinity between the substance with the electron transporting property, which is included in the second layer 812, and a substance, which is included in one layer contacting to the second layer 812 among the layers included in the third layer 813, is preferably set to be 2 eV or less, and more preferably, 1.5 eV or less. When the second layer 812 is made by using an n-type semiconductor, the difference between a work function of the n-type semiconductor and the electron affinity of the substance, which is included in the one layer contacting to the second layer 812 among the layers included in the third layer 813, is preferably set to be 2 eV or less, and more preferably, 1.5 eV or less.

Further, the one layer contacting to the second layer 812 among the layers included in the third layer 813 corresponds to the electron transporting layer 821 in the case where the third layer 813 comprises the structure of the present embodiment mode. When the third layer 813 includes only the light emitting layer, or, when the third layer 813 does not include the electron transporting layer 821 or the like, the light emitting layer corresponds to this layer contacting to the second layer 812. In the case where the light emitting layer is in contact with the second layer 812, a substance that is included in the layer contacting to the second layer 812 among the layers included in the third layer 813 corresponds to a substance for dispersing the light emitting substance or the light emitting substance itself. This is because, with respect to a light emitting substance like $Alq_3$ that can emit light without being dispersed in a host material and has an excellent carrier transporting ability, a layer made from only $Alq_3$ can function as a light emitting layer without dispersing the $Alq_3$ in a host material. Therefore, by contacting the third layer 813 to the second layer 812 in this manner, electrons can be easily injected in the third layer 813 from the second layer 812.

Preferably, one or both of the first electrode 801 and the second electrode 802 is/are formed by using a conductive substance that can transmit visible light. Accordingly, light generated in the light emitting layer can be emitted to the outside through at least one of the first electrode 801 and the second electrode 802.

The first electrode 801 is not particularly limited. For example, the first electrode can be formed using aluminum, indium tin oxide (ITO), indium tin oxide containing silicon oxide, or indium oxide containing 2 to 20 wt % zinc oxide. Additionally, gold (Au), platinum (Pt), nickel (Ni), tungsten (W), chromium (Cr), molybdenum (Mo), iron (Fe), cobalt (Co), copper (Cu), palladium (Pa) and the like can be used.

Also, the second electrode 802 is not particularly limited. When the second electrode 802 has a function of injecting the holes in the third layer 813 like the light emitting element of the present embodiment mode, the second electrode 802 is preferably formed using a substance with a large work function. Concretely, indium tin oxide (ITO), indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pa) and the like can be used. Further, for instance, the second electrode 802 can be formed by sputtering, evaporation, or the like.

As described above, the electron transporting layer 821 is interposed between the second layer 812 and the light emitting layer 822 in the present embodiment mode. The electron transporting layer 821 has a function of transporting the electrons injected therein to the light emitting layer 822. By providing the electron transporting layer 821 therebetween to isolate the first electrode 801 and the second layer 812 containing metal from the light emitting layer 822, light generated in the light emitting layer can be prevented from going out due to the metal.

The electron transporting layer 821 is not particularly limited and can be formed by using a substance with an electron transporting ability or a bipolar substance. As the bipolar substance, for example, TPAQn. NPADiBzQn, D-TriPhAQn, and the like can be given. The substance with the electron transporting ability is a substance of which an electron mobility is higher than a hole mobility and the ratio of the electron mobility to the hole mobility is 100 or more. As the substance with the electron transporting ability, for instance, a metal complex such as tris(8-quinolinolato)aluminum (abbreviation: Alq$_3$); tris(4-methyl-8-quinolinolato)aluminum (abbreviation: Almq$_3$); bis(10-hydroxybenzo[h]-quinolinato)beryllium (abbreviation: BeBq$_2$); bis(2-methyl-8-quinolinolato)-4-phenylphenolate-aluminum (abbreviation: BAlq); bis[2-(2-hydroxyphenyl)benzoxazolate]zinc (abbreviation: Zn(BOX)$_2$); and bis[2-(2-hydroxyphenyl)benzothiazolate] zinc (abbreviation: Zn(BTZ)$_2$) can be given. In addition, the following substances can be used as the substance with the electron transporting ability: 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); and the like. In particular, the electron transporting layer 821 is more preferably formed using a substance with an electron transporting ability or a bipolar substance that has an electron mobility of $1\times10^{-6}$ cm$^2$/Vs or more among the substances with the electron transporting abilities and the bipolar substances. This can reduce the driving voltage of the light emitting element. In addition, the electron transporting layer 821 may have a multilayer structure including two or more layers that are formed using the above mentioned substances.

As shown in FIG. 1, the hole transporting layer 823 is interposed between the second electrode 802 and the light emitting layer 822 in this embodiment mode. The hole transporting layer 823 has a function of transporting the holes injected from the second electrode 802 to the light emitting layer 822. By providing the hole transporting layer 823 between the second electrode 802 and the light emitting layer 822 to isolate the second electrode 802 from the light emitting layer 822, light generated in the light emitting layer can be prevented from going out due to the metal.

The hole transporting layer 823 is not particularly limited, and can be formed by using a substance with a hole transporting ability or a bipolar substance. The hole transporting substance is a substance of which a hole mobility is higher than an electron mobility and the ratio of the hole mobility to the electron mobility is 100 or more. As the substance with the hole transporting ability, for example, 4,4'-bis[N-(1-naphthyl)-N-phenylamino]biphenyl (abbreviation: NPB); 4,4'-bis[N-(3-methylphenyl)-N-phenylamino]biphenyl (abbreviation: TPD); 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); 4,4'-bis[N-{4-(N,N-di-m-tolylamino)phenyl}-N-phenylamino]biphenyl (abbreviation: DNTPD); 1,3,5-tris[N,N-di(m-tolyl)amino]benzene (abbreviation: m-MTDAB); 4,4',4''-tris(N-carbazolyl)triphenylamine (abbreviation: TCTA); phthalocyanine (abbreviation: H$_2$Pc); copper phthalocyanine (abbreviation: CuPc); vanadyl phthalocyanine (abbreviation: VOPc); and the like can be given. As the bipolar substance, TPAQn, NPADiBzQn, D-TriPhAQn, and the like can be given. In particular, the hole transporting layer 823 is more preferably formed using a substance with a hole transporting ability or a bipolar substance that has a hole mobility of $1\times10^{-6}$ cm$^2$/Vs or more among the substances with the hole transporting abilities and the bipolar substances. This can reduce the driving voltage of the light emitting element. In addition, the hole transporting layer 823 may have a multilayer structure including two or more layers that are formed using the above mentioned substances.

Further, as shown in FIG. 1, the hole injecting layer 824 may be interposed between the second electrode 802 and the hole transporting layer 823. The hole injecting layer 824 has a function of assisting injection of the holes in the hole transporting layer 823 from the second electrode 802.

The hole injecting layer 824 is not particularly limited. The hole injecting layer can be formed by using metal oxide such as molybdenum oxide, vanadium oxide, ruthenium oxide, tungsten oxide and manganese oxide. In addition, the hole injecting layer 824 can be formed by using the above-described phthalocyanine compound such as H$_2$Pc, CuPC and VOPc, the above-described aromatic amine compound such as DNTPD, or a high molecular weight material such as a poly(ethylenedioxythiophene)/poly(styrene sulfonate) mixture (PEDOT/PSS). Furthermore, the hole injecting layer 824 may be formed by mixing a bipolar substance and a substance that exhibits an electron accepting ability with respect to the bipolar substance.

The above described light emitting element of the present invention has high reliability in which the driving voltage is slightly increased with the accumulation of light emitting time. This is because the first layer or the second layer is difficult to be crystallized by mixing a bipolar substance and a substance exhibiting an electron accepting ability or an electron donating ability with respect to the bipolar substance. Furthermore, the voltage applied for obtaining a predetermined luminance is referred to as the driving voltage.

The light emitting element of the present invention has slight variation in voltage applied to the light emitting element to flow the predetermined current through the light emitting element, which is dependent on the thickness of the layer generating the holes (i.e., the first layer 811). Therefore, for example, by increasing the thickness of the first layer 811 to increase the distance between the first and second electrodes, the first electrode 801 can be easily prevented from short-circuiting with the second electrode 802.

Embodiment Mode 2

Figure 12:
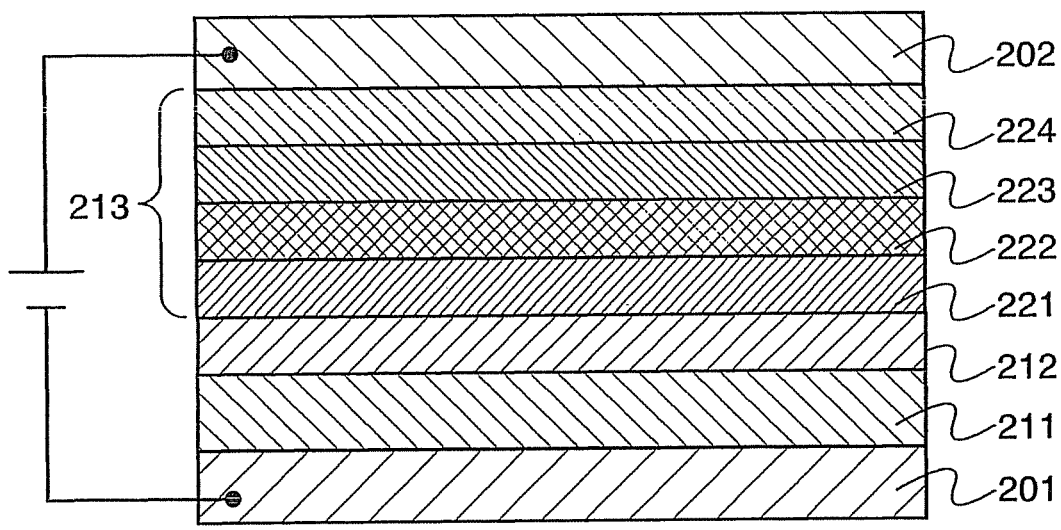
FIG. 12 is a diagram showing an example of a laminated structure of a light emitting element in accordance with the present invention.

This embodiment mode will describe a light emitting element in which a light extraction efficiency is increased by controlling the thickness of a layer generating holes and an optical distance between a reflecting surface and a light emitting surface (or a light emitting region) is controlled to reduce the change in emission spectrum depending on an angle of seeing the light emitting surface, with reference to FIG. 12.

A light emitting element of FIG. 12 comprises a first layer 211 generating holes, a second layer 212 generating electrons and a third layer 213 containing a light emitting substance between a first electrode 201 and a second electrode 202. The first layer 211, the second layer 212 and the third layer 213 are sequentially laminated while sandwiching the second layer 212 between the first and third layers. The first layer 211 is in contact with the first electrode while the third layer 213 is in contact with the second electrode 202.

The first electrode 201 is an electrode formed using a conductive material that has high reflectance, or, a reflecting electrode. As the conductive material having the high reflectance, aluminum, silver, an alloy of the metal (e.g., an Al:Li alloy, an Mg:Ag alloy etc.) and the like can be used. The conductive material preferably has the reflectance of 50% or more and 100% or less. The second electrode 202 is formed using a conductive material that can transmit visible light. The conductive material that can transmit visible light is not particularly limited, and indium tin oxide, indium tin oxide containing silicon oxide, indium oxide containing 2 to 20 wt % zinc oxide, or the like can be used.

When applying the voltage to the light emitting element such that a potential of the second electrode 202 is higher than that of the first electrode 201, holes are injected in the first electrode 201 from the first layer 211 while electrons are injected in the third layer 213 from the second layer 212. Also, holes are injected in the third layer 213 from the second electrode 202.

The electrons and holes are recombined in the third layer 213 so that a light emitting substance is excited. The light emitting substance emits light upon returning to the ground state from the excited state. A region in which light is generated in this way is particularly referred to as a light emitting region. Also, a layer including a light emitting substance for forming the light emitting region is referred to as a light emitting layer. Further, the light emitting region is formed at least in a part of the light emitting layer.

In the light emitting element of the present embodiment mode, the third layer 213 includes an electron transporting layer 221, a hole transporting layer 223 and a hole injecting layer 224, together with the light emitting layer 222. Further, the structure of the third layer 213 is not limited to the one shown in FIG. 12. For instance, the third layer 213 may have a single layer structure including only the light emitting layer.

The first layer 211, the second layer 212 and the third layer 213 may be formed by using the same materials of the first layer 811, the second layer 812 and the third layer 813 as described in Embodiment Mode 1, respectively. Similarly, the electron transporting layer 221, the light emitting layer 222, the hole transporting layer 223 and the hole injecting layer 224 may be formed by using the same materials of the electron transporting layer 821, the light emitting layer 822, the hole transporting layer 823 and the hole injecting layer 824 as described in Embodiment Mode 1, respectively.

When light enters into the reflecting electrode, a phase inversion is caused in the reflected light. By the effect of interference of light due to the phase inversion, when an optical distance between the light emitting region and the reflecting electrode (i.e., reflectance×distance) is the emission wavelength multiplied by $(2m-1)/4$ (m is a given positive integer), or, multiplied by $\frac{1}{4}, \frac{3}{4}, \frac{5}{4}...$, the light extraction efficiency is increased. Meanwhile, when the optical distance therebetween is the emission wavelength multiplied by $m/2$ (m is a given positive integer), or, $\frac{1}{2}, 1, \frac{3}{2}...$, the light extraction efficiency is reduced.

Therefore, in the case where the light emitting region is placed in the vicinity of an interface between the light emitting layer 222 and the hole transporting layer 223 in the light emitting element of the present embodiment mode, the respective thicknesses of the first layer 211, the second layer 212, the electron transporting layer 221 and the light emitting layer 222 are preferably adjusted so as to satisfy the following expression 4. Accordingly, light can be emitted to the outside efficiently. Also, the increase in resistance with the increase in film thicknesses of $d_i$ and $d_{ii}$, can be suppressed. Here the resistance indicates a value obtained by dividing the applied voltage value (V) by the current (mA) following through the light emitting element in accordance with the applied voltage.

$$n_i d_i + n_{ii} d_{ii} + n_1 d_1 + n_p d_p = \frac{(2m-1)\lambda}{4} \qquad \text{[Expression 4]}$$

In the expression 4, $n_i$ represents the refractive index of the first layer 211; $d_i$, the thickness of the first layer 211; $n_{ii}$, the refractive index of the second layer 212; $d_{ii}$, the thickness of the second layer 212; the refractive index of the electron transporting layer 221; $d_1$, the thickness of the electron transporting layer 221; $n_p$, the refractive index of the light emitting layer 222; $d_p$, the thickness of the light emitting layer 222; $\lambda$, the wavelength of light generated in the light emitting element; and m, a given positive integer.

On the other hand, in the case where the light emitting region is placed in the vicinity of an interface between the light emitting layer 222 and the electron transporting layer 221 in the light emitting element of the present embodiment mode, the respective thicknesses of the first layer 211, the second layer 212 and the electron transporting layer 221 are preferably adjusted so as to satisfy the expression 5. Accordingly, light can be emitted to the outside portion efficiently. In addition, the increase in the resistance with the increase in film thicknesses of $d_i$ and $d_{ii}$ can be suppressed.

$$n_i d_i + n_{ii} d_{ii} + n_1 d_1 = \frac{(2m-1)\lambda}{4} \qquad \text{[Expression 5]}$$

In the expression 5, $n_i$ represents the refractive index of the first layer 211; $d_i$, the thickness of the first layer 211; $n_{ii}$, the refractive index of the second layer 212; the thickness of the second layer 212; $n_1$, the refractive index of the electron transporting layer 221; $d_1$, the thickness of the electron transporting layer 221; $\lambda$, the wavelength of light generated in the light emitting element; and m, a given positive integer.

Further, when the light emitting region is formed in the entire area of the light emitting layer 222 in the light emitting element of this embodiment mode, the respective thicknesses of the first layer 211, the second layer 212 and the electron transporting layer 221 are preferably adjusted so as to satisfy the following expression 6. By controlling these thicknesses, light can be emitted to the outside efficiently.

$$\frac{(2m-1)\lambda}{4} - n_{ii}d_{ii} - n_1d_1 - n_pd_p \leq \quad \text{[Expression 6]}$$

$$n_id_i \leq \frac{(2m-1)\lambda}{4} - n_{ii}d_{ii} - n_1d_1$$

In the expression 6, $n_i$ represents the refractive index of the first layer 211; $d_i$, the thickness of the first layer 211; $n_{ii}$ the refractive index of the second layer 212; $d_{ii}$, the thickness of the second layer 212; $n_1$, the refractive index of the electron transporting layer 221; $d_1$, the thickness of the electron transporting layer 221; $n_p$, the refractive index of the light emitting layer 222; $d_p$, the thickness of the light emitting layer 222; $\lambda$, the wavelength of light generated in the light emitting element; and m, a given positive integer.

In the expressions 4, 5 and 6, m preferably satisfies the relation of $1 \leq m \leq 10$. Concretely, the light generated in the light emitting element indicates light emitted to outside of the light emitting element that is derived from the light emitting substance. Also, the wavelength of light emission indicates a theoretical figure with respect to a wavelength showing a maximal value in emission spectrum.

Furthermore, the light emitting element having the structure in which the electron transporting layer 221 is sandwiched between the second layer 212 and the light emitting layer 222 is explained in this embodiment mode. Alternatively, the light emitting element may include a different layer between the second layer 212 and the light emitting layer 222, rather than the electron transporting layer 221. In this case, $n_1d_1$ in the expression 6 can be expressed as follows: $n_1d_1 + n_2d_2 \ldots + n_kd_k + \ldots$.

Embodiment Mode 3

The light emitting element according to the present invention is a highly reliable element having slight increase in the driving voltage with the accumulation of light emitting time. By applying the light emitting element of the invention to, e.g., a pixel portion, a light emitting device having low power consumption can be obtained. Also, the light emitting element of the invention can prevent the short-circuiting between electrodes easily. Therefore, by applying the light emitting element of the invention to a pixel portion, a light emitting device capable of displaying favorable images having less defects due to the short-circuiting can be obtained. Furthermore, the light emitting element in accordance with the invention can easily emit light to the outside. By applying the light emitting element of the invention to a pixel portion, a light emitting device that can perform display operation at low power consumption can be obtained.

In this embodiment mode, circuit structures and driving methods of a light emitting device having a display function will be described with reference to FIGS. 3, 4, 5 and 6.

Figure 3:
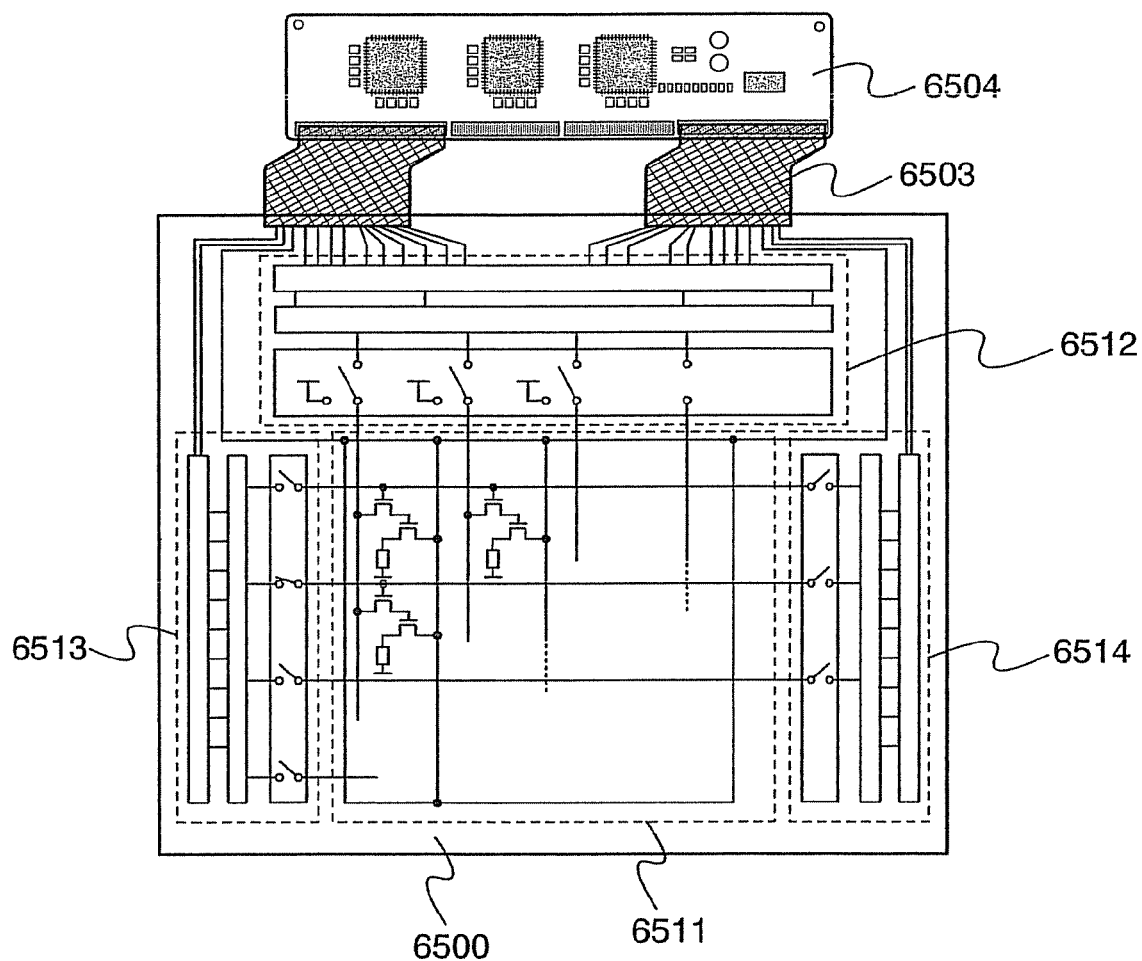
FIG. 3 is a diagram showing an example of a light emitting device to which the present invention is applied.

FIG. 3 is a schematic top view of a light emitting device to which the present invention is applied. In FIG. 3, a pixel portion 6511, a source signal line driver circuit 6512, a writing gate signal line driver circuit 6513 and an erasing gate signal line driver circuit 6514 are provided over a substrate 6500. The source signal line driver circuit 6512, the writing gate signal line driver circuit 6513 and the erasing gate signal line driver circuit 6514 are connected to FPCs (flexible printed circuits) 6503, which are external input terminals, through wiring groups, respectively. The source signal line driver circuit 6512, the writing gate signal line driver circuit 6513 and the erasing gate signal line driver circuit 6514 receive video signals, clock signals, start signals, reset signals and the like from the FPCs 6503, respectively. The FPCs 6503 are attached with printed wiring boards (PWBs) 6504. Further, a driver circuit portion is not necessary to be formed over the same substrate as the pixel portion 6511. For example, the driver circuit portion may be provided outside of the substrate by utilizing a TCP in that an IC chip is mounted over an FPC having a wiring pattern, or the like.

A plurality of source signal lines extending in columns are aligned in rows in the pixel portion 6511. Also, power supply lines are aligned in rows. A plurality of gate signal lines extending in rows are aligned in columns in the pixel portion 6511. In addition, a plurality of circuits each including a light emitting element are aligned in the pixel portion 6511.

Figure 4:
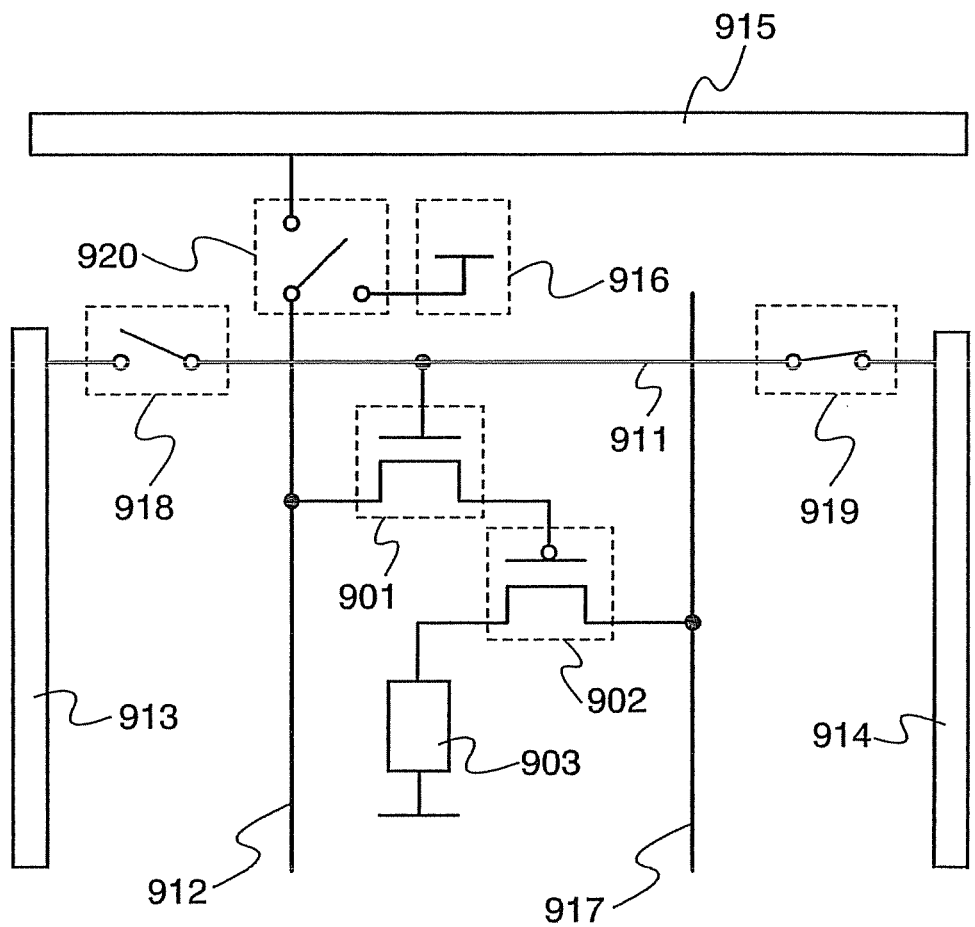
FIG. 4 is a diagram explaining an example of a circuit included in a light emitting device to which the present invention is applied.

FIG. 4 is a diagram showing a circuit for operating one pixel. The circuit as shown in FIG. 4 comprises a first transistor 901, a second transistor 902 and a light emitting element 903.

Each of the first and second transistors 901 and 902 is a three terminal element including a gate electrode, a drain region and a source region. A channel region is interposed between the drain region and the source region. The region serving as the source region and the region serving as the drain region are changed depending on a structure of a transistor, an operational condition and the like so that it is difficult to determine which region serves as the source region or the drain region. Therefore, regions serving as the source or the drain are denoted as a first electrode of a transistor and a second electrode of the transistor in this embodiment mode, respectively.

A gate signal line 911 and a writing gate signal line driver circuit 913 are provided to be electrically connected or disconnected to each other by a switch 918. The gate signal line 911 and an erasing gate signal line driver circuit 914 are provided to be electrically connected or disconnected to each other by a switch 919. A source signal line 912 is provided to be electrically connected to either a source signal line driver circuit 915 or a power source 916 by a switch 920. A gate of the first transistor 901 is electrically connected to the gate signal line 911. The first electrode of the first transistor is electrically connected to the source signal line 912 while the second electrode thereof is electrically connected to a gate electrode of the second transistor 902. The first electrode of the second transistor 902 is electrically connected to a current supply line 917 while the second electrode thereof is electrically connected to one electrode included in a light emitting element 903. Further, the switch 918 may be included in the writing gate signal line driver circuit 913. The switch 919 may also be included in the erasing gate signal line driver circuit 914. In addition, the switch 920 may be included in the source signal line driver circuit 915.

Figure 5:
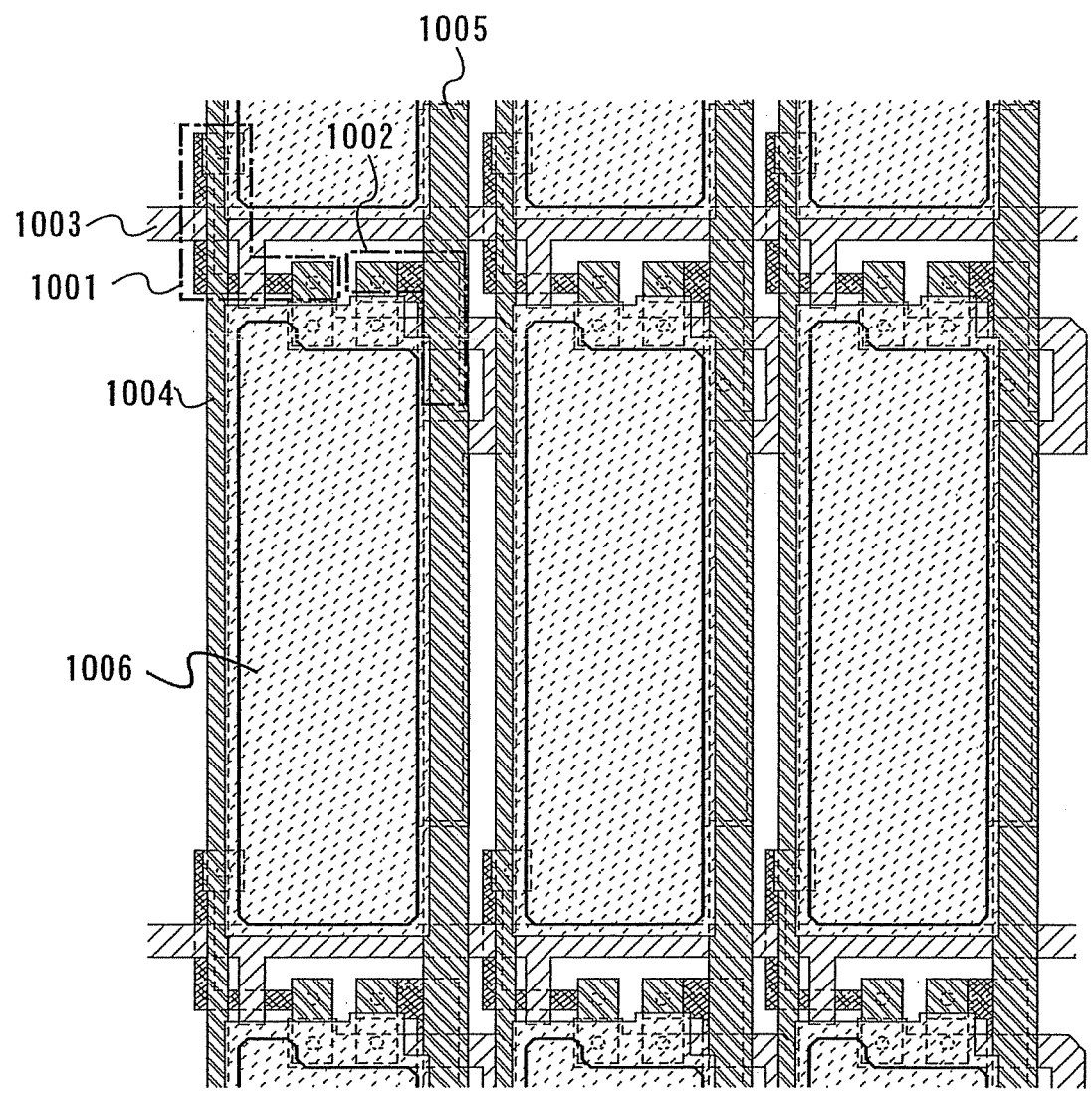
FIG. 5 is a top view of a light emitting device to which the present invention is applied.

The arrangement of transistors, light emitting elements and the like in the pixel portion is not particularly limited. For example, the arrangement as shown in a top view of FIG. 5 can be employed. In FIG. 5, a first electrode of a first transistor 1001 is connected to a source signal line 1004 while a second electrode of the first transistor is connected to a gate electrode of a second transistor 1002. A first electrode of the second transistor is connected to a current supply line 1005 and a second electrode of the second transistor is connected to an electrode 1006 of a light emitting element. A part of the gate signal line 1003 functions as a gate electrode of the first transistor 1001.

Figure 6:
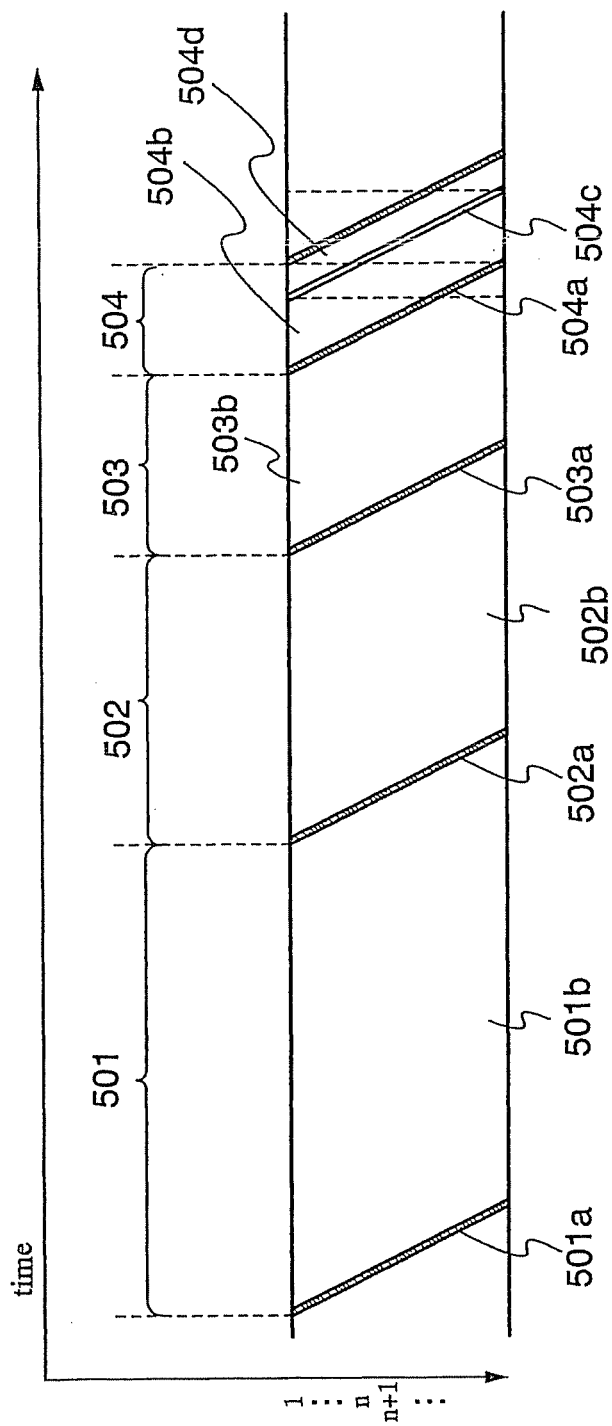
FIG. 6 is a diagram explaining a frame operation of a light emitting device to which the present invention is applied.

Next, the method for driving the light emitting device will be described below. FIG. 6 is a diagram explaining an operation of a frame with time. In FIG. 6, a horizontal direction indicates time passage while a longitudinal direction indicates the number of scanning stages of a gate signal line.

When an image is displayed on the light emitting device of the present invention, a rewriting operation and a displaying operation are carried out repeatedly during a displaying period. The number of the rewriting operation is not particularly limited. However, the rewriting operation is preferably performed about 60 times a second such that a person who watches a displayed image does not detect flicker in the image. A period of operating the rewriting operation and the displaying operation of one image (one frame) is, herein, referred to as one frame period.

As shown in FIG. 6, one frame is divided into four sub-frames 501, 502, 503 and 504 including writing periods 501a, 502a, 503a and 504a and holding periods 501b, 502b, 503b and 504b. The light emitting element applied with a signal for emitting light emits light during the holding periods. The length ratio of the holding periods in the first sub-frame 501, the second sub-frame 502, the third sub-frame 503 and the fourth sub-frame 504 satisfies $2^3:2^2:2^1:2^0=8:4:2:1$. This allows the light emitting device to exhibit 4-bit gray scale. Further, the number of bits and the number of gray scales are not limited to those as shown in this embodiment mode. For instance, one frame may be divided into eight sub-frames so as to achieve 8-bit gray scale.

The operation in one frame will be described. In the sub-frame 501, the writing operation is first performed in a first row to a last row, sequentially. Therefore, the starting time of the writing periods is varied for each row. The holding period 501b sequentially starts in the rows in which the writing period 501a has been terminated. In the holding period 501b, a light emitting element applied with a signal for emitting light remains in a light emitting state. Upon terminating the holding period 501b, the sub-frame 501 is changed to the next sub-frame 502 sequentially in the rows. In the sub-frame 502, a writing operation is sequentially performed in the $1^{st}$ row to the last row in the same manner as the sub-frame 501. The above-mentioned operations are carried out repeatedly up to the holding period 504b of the sub-frame 504 and then terminated. After terminating the operation in the sub-frame 504, an operation in the next frame starts. Accordingly, the sum of the light-emitting time in respective sub-frames corresponds to the light emitting time of each light emitting element in one frame. By changing the light emitting time for each light emitting element and combining such the light emitting elements variously within one pixel, various display colors with different brightness and different chromaticity can be obtained.

When the holding period is intended to be forcibly terminated in the row in which the writing period has already been terminated and the holding period has started prior to terminating the writing operation up to the last row as shown in the sub-frame 504, an erasing period 504c is preferably provided after the holding period 504b so as to stop light emission forcibly. The row where light emission is forcibly stopped does not emit light for a certain period (this period is referred to as a non light emitting period 504d). Upon terminating the writing period in the last row, a writing period of a next sub-frame (or, a next frame) starts sequentially from a first row. This can prevent the writing period in the sub-frame 504 from overlapping with the writing period in the next sub-frame.

Although the sub-frames 501 to 504 are arranged in order of increasing the length of the holding period in this embodiment mode, they are not necessary to be arranged in this order. For example, the sub-frames may be arranged in ascending order of the length of the holding period. Alternatively, the sub-frames may be arranged in random order. In addition, these sub-frames may further be divided into a plurality of frames. That is, scanning of gate signal lines may be performed at several times during a period of supplying same video signals.

The operations in the wiring period and the erasing period of the circuits as shown in FIG. 4 will be described below.

The operation in the writing period will be described first. In the writing period, the gate signal line 911 in the n-th row (n is a natural number) is electrically connected to the writing gate signal line driver circuit 913 via the switch 918. The gate signal line 911 in the n-th row is not electrically connected to the erasing gate signal line driver circuit 914. The source signal line 912 is electrically connected to the source signal line driver circuit 915 via the switch 920. In this case, a signal is input in a gate of the first transistor 901 connected to the gate signal line 911 in the n-th row (n is a natural number), thereby turning the first transistor 901 on. At this moment, video signals are simultaneously input in the source signal lines in the first to last columns. Further, the video signals input from the source signal line 912 in each column are independent from one another. The video signals input from the source signal line 912 are input in a gate electrode of the second transistor 902 via the first transistor 901 connected to the respective source signal lines. At this time, the amount of current supplied to the light emitting element 903 from the current supply line 917 is decided by the signals input in the second transistor 902. Also, it is decided whether the light emitting element 903 emits light or emits no light depending on the amount of current. For instance, when the second transistor 902 is of a P-channel type, the light emitting element 903 emits light by inputting a low level signal in the gate electrode of the second transistor 902. On the other hand, when the second transistor 902 is of an N-channel type, the light emitting element 903 emits light by inputting a high level signal in the gate electrode of the second transistor 902.

Next, the operation in the erasing period will be described. In the erasing period, the gate signal line 911 in the n-th row (n is a natural number) is electrically connected to the erasing gate signal line driver circuit 914 via the switch 919. The gate signal line 911 in the n-th row is not electrically connected to the writing gate signal line deriver circuit 913. The source signal line 912 is electrically connected to the power source 916 via the switch 920. In this case, upon inputting a signal in the gate of the first transistor 901, which is connected to the gate signal line 911 in the n-th row, the first transistor 901 is turned on. At this time, erasing signals are simultaneously input in the first to last columns of the source signal lines. The erasing signals input from the source signal line 912 are input in the gate electrode of the second transistor 902 via the first transistor 901, which is connected to each source signal line. A supply of current flowing through the light emitting element 903 from the current supply line 917 is forcibly stopped by the signals input in the second transistor 902. This makes the light emitting element 903 emit no light forcibly. For example, when the second transistor 902 is of a P-channel type, the light emitting element 903 emits no light by inputting a high level signal in the gate electrode of the second transistor 902. On the other hand, when the second transistor 902 is of an N-channel type, the light emitting element 903 emits no light by inputting a low level signal in the gate electrode of the second transistor 902.

Further, in the erasing period, a signal for erasing is input in the n-th row (n is a natural number) by the above-mentioned operation. However, as mentioned above, the n-th row sometimes remains in the erasing period while another row (e.g., an m-th row (m is a natural number)) remains in the writing period. In this case, since a signal for erasing is necessary to be input in the n-th row and a signal for writing is necessary to be input in the m-th row by utilizing the source signal line in the same column, the after-mentioned operation is preferably carried out.

After the light emitting element 903 in the n-th row becomes a non-light emitting state by the above-described operation in the erasing period, the gate signal line 911 and the erasing gate signal line driver circuit 914 are immediately disconnected to each other and the source signal line 912 is connected to the source signal line driver circuit 915 by turning the switch 920 on/off. The gate signal line 911 and the writing gate signal line driver circuit 913 are connected to each other while the source signal line and the source signal line driver circuit 915 are connected to each other. A signal is selectively input in the signal line in the m-th row from the writing gate signal line driver circuit 913 and the first transistor is turned on while signals for writing are input in the source signal lines in the first to last columns from the source signal line driver circuit 915. By inputting these signals, the light emitting element in the m-th row emits light or no light.

After terminating the writing period in the m-th row as mentioned above, the erasing period immediately starts in the (n+1)-th row. Therefore, the gate signal line 911 and the writing gate signal line driver circuit 913 are disconnected to each other while the source signal line is connected to the power source 916 by turning the switch 920 on/off. Also, the gate signal line 911 and the writing gate signal line driver circuit 913 are disconnected to each other while the gate signal line 911 is connected to the erasing gate signal line driver circuit 914. A signal is selectively input in the gate signal line in the (n+1)-th row from the erasing gate signal line driver circuit 914 to input the signal in the first transistor while an erasing signal is input therein from the power source 916. Upon terminating the erasing period in the (n+1)-th row in this manner, the writing period immediately starts in the (m+1)-th row. The erasing period and the writing period may be repeated alternatively until the erasing period of the last row in the same manner.

Although the writing period in the m-th row is provided between the erasing period in the n-th row and the erasing period of the (n+1)-th row in this embodiment mode, the present invention is not limited thereto. The writing period of the m-th row may be provided between the erasing period in the (n−1)-th row and the erasing period in the n-th row.

Furthermore, in this embodiment mode, when the non-light emitting period 504d is provided like the sub-frame 504, the operation of disconnecting the erasing gate signal line driver circuit 914 from one gate signal line while connecting the writing gate signal line driver circuit 913 to another gate signal line is carried out repeatedly. This operation may be performed in a frame in which a non-light emitting period is not particularly provided.

Embodiment Mode 4

An example of a cross sectional view of a light emitting device including a light emitting element of the present invention will be described with reference to FIGS. 7A to 7C.

Figure 7A:
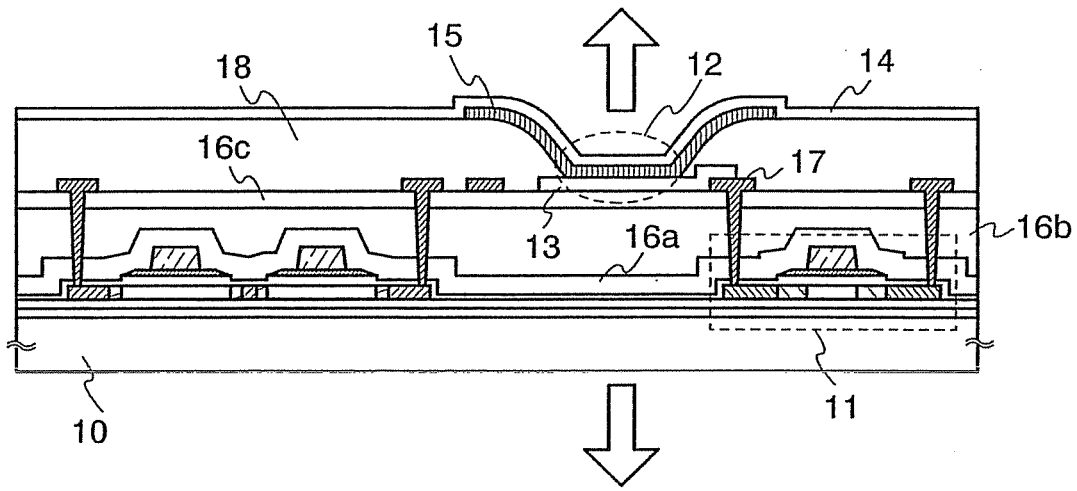
FIGS. 7A to 7C are cross sectional views of light emitting devices to which the present invention is applied.
Figure 7B:
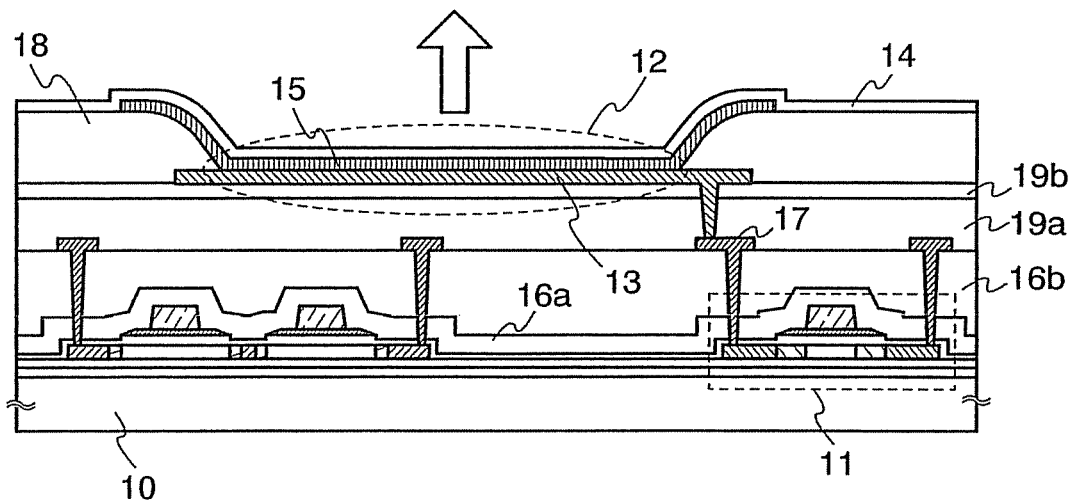
Figure 7C:
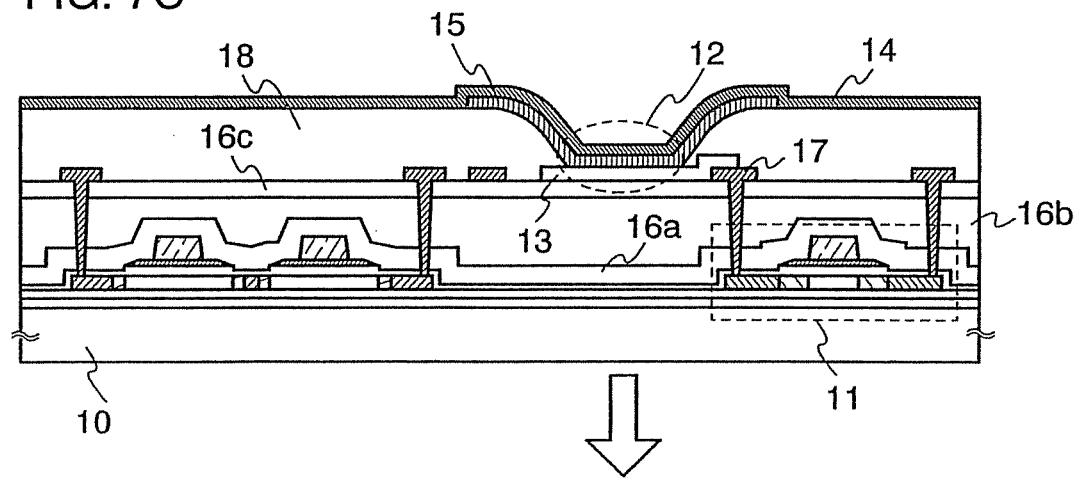

In each of FIGS. 7A to 7C, a region surrounded by a dashed line represents a transistor 11 that is provided for driving a light emitting element 12 of the invention. The light emitting element 12 of the invention comprises a layer 15 in that a layer generating holes, a layer generating electrons and a layer including a light emitting substance are interposed between a first electrode 13 and a second electrode 14. A drain of the transistor 11 and the first electrode 13 are electrically connected to each other by a wiring 17 that passes through a first interlayer insulating film 16 (16a, 16b and 16c). The light emitting element 12 is isolated from another light emitting element provided adjacent to the light emitting element 12 by a partition wall layer 18. The light emitting device of the invention having this structure is provided over a substrate 10 in this embodiment mode.

The transistor 11 as shown in each FIGS. 7A to 7C is a top-gate type transistor in which a gate electrode is provided on a side of a semiconductor layer opposite to the substrate. Further, the structure of the transistor 11 is not particularly limited. For example, a bottom-gate type transistor may be employed. In the case of using a bottom-gate type transistor, either a transistor in which a protection film is formed on a semiconductor layer of a channel (a channel protection type transistor) or a transistor in which a part of a semiconductor layer of a channel is etched (a channel etched type transistor) may be used.

The semiconductor layer included in the transistor 11 may be any of a crystalline semiconductor, an amorphous semiconductor, a semiamorphous semiconductor, and the like.

Concretely, the semiamorphous semiconductor has an intermediate structure between an amorphous structure and a crystalline structure (including a single crystal structure and a polycrystalline structure), and a third condition that is stable in term of free energy. The semiamorphous semiconductor further includes a crystalline region having a short range order along with lattice distortion. A crystal grain with a size of 0.5 to 20 nm is included in at least a part of an semiamorphous semiconductor film. Raman spectrum is shifted toward lower wavenumbers than 520 cm$^{-1}$. The diffraction peaks of (111) and (220), which are believed to be derived from Si crystal lattice, are observed in the semiamorphous semiconductor by the X-ray diffraction. The semiamorphous semiconductor contains hydrogen or halogen of at least 1 atom % or more for terminating dangling bonds. The semiamorphous semiconductor is also referred to as a microcrystalline semiconductor. The semiamorphous semiconductor is formed by glow discharge decomposition with silicide gas (plasma CVD). As for the silicide gas, $SiH_4$, $Si_2H_6$, $SiH_2Cl_2$, $SiHCl_3$, $SiCl_4$, $SiF_4$ and the like can be used. The silicide gas may also be diluted with $H_2$, or a mixture of $H_2$ and one or more of rare gas elements selected from He, Ar, Kr and Ne. The dilution ratio is set to be in the range of 1:2 to 1:1,000. The pressure is set to be approximately in the range of 0.1 to 133 Pa. The power frequency is set to be 1 to 120 MHz, and preferably, 13 to 60 MHz. The substrate heating temperature may be set to be 300° C. or less, more preferably, 100 to 250° C. With respect to impurity elements contained in the film, each concentration of impurities for atmospheric constituents such as oxygen, nitrogen and carbon is preferably set to be $1\times10^{20}$/cm$^3$ or less. In particular, the oxygen concentration is set to be $5\times10^{19}$/cm$^3$ or less, and preferably, $1\times10^{19}$/cm$^3$ or less. Further, the mobility of a TFT (thin film transistor) using the semiamorphous semiconductor is about 1 to 10 m$^2$/Vsec.

As a specific example of a crystalline semiconductor layer, a semiconductor layer made from single crystalline silicon, polycrystalline silicon, silicon germanium, or the like can be given. The semiconductor layer formed using such material may be formed by laser crystallization. For example, these materials may be formed by crystallization with use of the solid phase growth method using nickel and the like.

When a semiconductor layer is formed using an amorphous substance, e.g., amorphous silicon, it is preferable to use a light emitting device with circuits including only N-channel transistors as the transistor 11 and other transistor (a transistor included in a circuit for driving a light emitting element). Alternatively, a light emitting device with circuits including either N-channel transistors or P-channel transistors may be employed. Also, a light emitting device with circuits including both an N-channel transistor and a P-channel transistor may be used.

The first interlayer insulating film 16 may include plural layers (e.g., first interlayer insulating layers 16a, 16b and 16c) as shown in FIGS. 7A and 7C or a single layer. Concretely, the interlayer insulating layer 16a is formed using an inorganic material such as silicon oxide and silicon nitride. The interlayer insulating layer 16b is formed using acrylic, siloxane (which is a compound that has a skeleton structure formed by silicon (Si)-oxygen (O) bonds and includes hydrogen or an organic group such as an alkyl group as its substituent), or a substance with a self-planarizing property that can be formed by applying a liquid such as silicon oxide. The interlayer insulating layer 16c is made from a silicon nitride film containing argon (Ar). The substances constituting the respective layers are not particularly limited thereto. Therefore, substances other than the above-mentioned substances may be employed. Alternatively, a layer formed using a substance other than the above mentioned substances may be provided in combination with the above described layers. Accordingly, the first interlayer insulating film 16 may be formed by using both an inorganic material and an organic material or by using either an inorganic material or an organic material.

The edge portion of the partition wall layer 18 preferably has a shape in which the radius of curvature is continuously varied. This partition wall layer 18 is formed by using acrylic, siloxane, resist, silicon oxide, and the like. Further, the partition wall layer 18 may be formed using any one or both of an inorganic film and an organic film.

FIGS. 7A and 7C show the structures in which only the first interlayer insulating film 16 is sandwiched between the transistors 11 and the light emitting elements 12. Alternatively, as shown in FIG. 7B, the first interlayer insulating film 16 (16a and 16b) and a second interlayer insulting film 19 (19a and 19b) may be provided between the transistor 11 and the light emitting element 12. In the light emitting device as shown in FIG. 7B, the first electrode 13 passes through the second interlayer insulating film 19 to be connected to the wiring 17.

The second interlayer insulating film 19 may include either plural layers or a single layer as well as the first interlayer insulating film 16. The interlayer insulating layer 19a is formed using acrylic, siloxane, or a substance with a self-planarizing property that can be formed by applying a liquid such as silicon oxide. The interlayer insulating layer 19b is formed using a silicon nitride film containing argon (Ar). The substances constituting the respective layers of the second interlayer insulating film are not particularly limited thereto. Therefore, substances other than the above-mentioned substances may be employed. Alternatively, a layer made from a substance other than the above-mentioned substances may be provided in combination with the layers 19a and 19b. Accordingly, the second interlayer insulating film 19 may be formed by using both an inorganic material and an organic material or by using either an inorganic material or an inorganic material.

When the first electrode and the second electrode are both formed using a substance with a light transmitting property in the light emitting element 12, light generated in the light emitting element can be emitted through both the first electrode 13 and the second electrode 14 as shown in arrows in FIG. 7A. When only the second electrode 14 is formed using a substance with a light transmitting property, light generated in the light emitting element 12 can be emitted only through the second electrode 14 as shown in an arrow of FIG. 7B. In this case, the first electrode 13 is preferably formed using a material with high reflectance. Alternatively, a film (reflection film) formed using a material with high reflectance is preferably provided underneath the first electrode 13. When only the first electrode 13 is formed using a substance with a light transmitting property, light generated in the light emitting element 12 can be emitted only through the first electrode 13 as shown in an arrow of FIG. 7C. In this case, the second electrode 14 is preferably formed using a material with high reflectance or a reflection film is preferably provided over the second electrode 14.

Moreover, the light emitting element 12 may be formed by laminating the layer 15 that is operated in applying the voltage to the light emitting element such that a potential of the second electrode 14 is higher than that of the first electrode 13. Alternatively, the light emitting element 12 may be formed by laminating the layer 15 that is operated in applying the voltage to the light emitting element such that a potential of the second electrode 14 is lower than that of the first electrode 13. In the former case, the transistor 11 is an N-channel transistor. In the latter case, the transistor 11 is a P-channel transistor.

Figure 13:
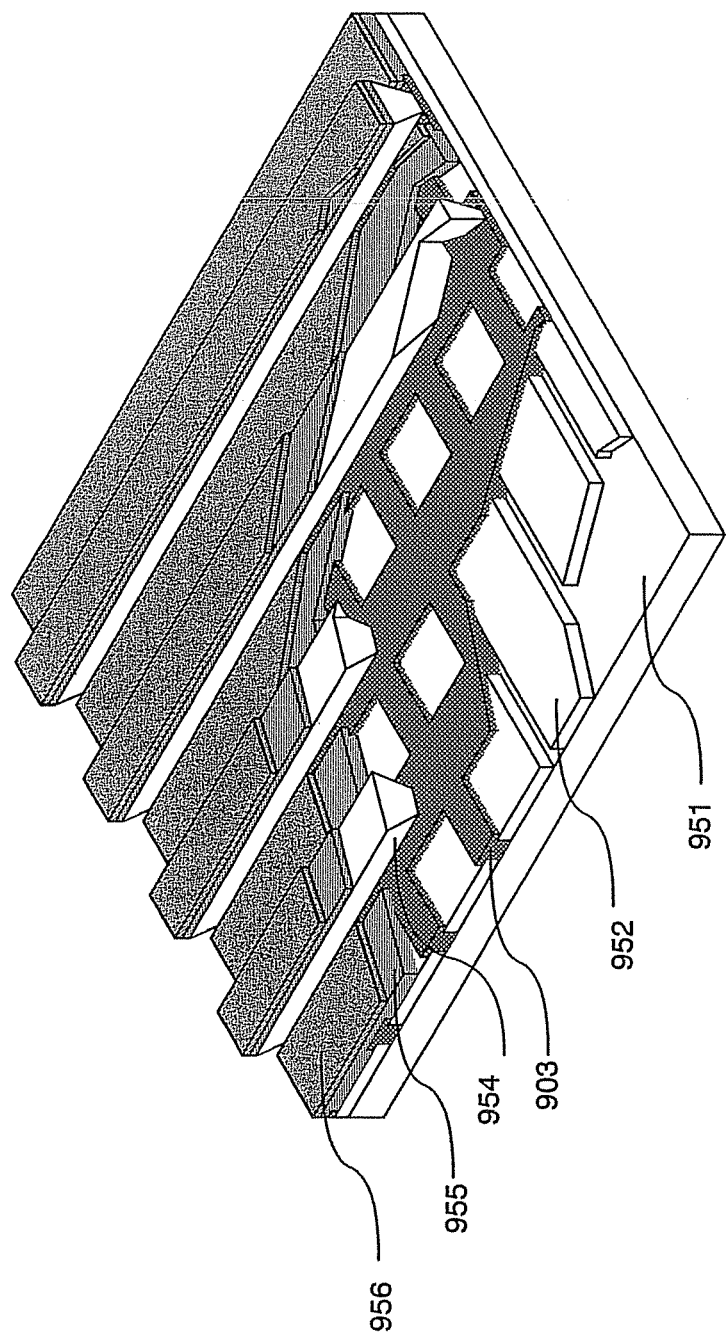
FIG. 13 is a perspective view of a light emitting device to which the present invention is applied.

As set forth above, an active light emitting device that controls the driving of the light emitting element using the transistor is described in this embodiment mode. In addition, a passive light emitting device that drives a light emitting element without providing a driving element such as a transistor may be employed. FIG. 13 shows a perspective view of the passive light emitting device that is manufactured in accordance with the present invention. In FIG. 13, a layer 955 in that a layer containing a light emitting substance, a layer generating electrons and a layer generating holes are sequentially laminated is provided between an electrode 952 and an electrode 956. The edge of the electrode 952 is covered with an insulating layer 903. A partition wall layer 954 is provided over the insulating layer 903. The sidewalls of the partition wall layer 954 are aslope so that a distance between both sidewalls is gradually narrowed toward the surface of the substrate. That is, a cross section in a narrow side of the partition wall layer 954 is a trapezoidal shape, and a lower side (which faces a surface of the insulating layer 903 and is in contact with the insulating layer 903) is shorter than an upper side (which faces the surface of the insulating layer 903 and is not in contact with the insulating layer 903). By providing the partition wall layer 954 in this manner, defects of the light emitting element due to static charge and the like can be prevented. In addition, by forming the passive light emitting device utilizing the light emitting element of the invention, which is operated at low driving voltage, the passive light emitting device can be driven at low power consumption.

Embodiment Mode 5

By mounting a light emitting device according to the present invention, an electronic appliance with low power consumption in a display portion or the like can be obtained. Also, by mounting a light emitting device of the invention, an electronic appliance such as a display device capable of displaying favorable images with few defects in pixels and the like can be obtained. Furthermore, by utilizing the light emitting device of the invention, an electronic appliance having low power consumption can be obtained.

Figure 8A:
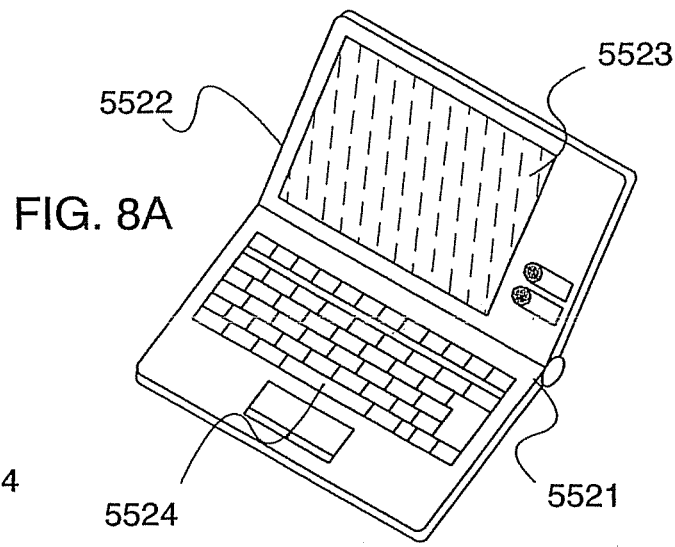
FIGS. 8A to 8C are diagrams showing electronic appliances to which the present invention is applied.
Figure 8B:
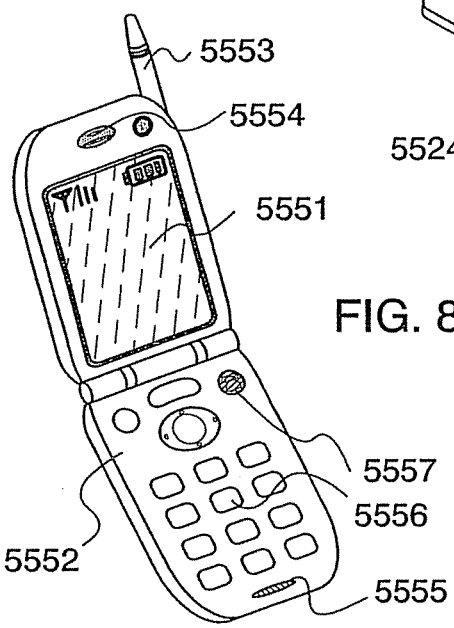
Figure 8C:
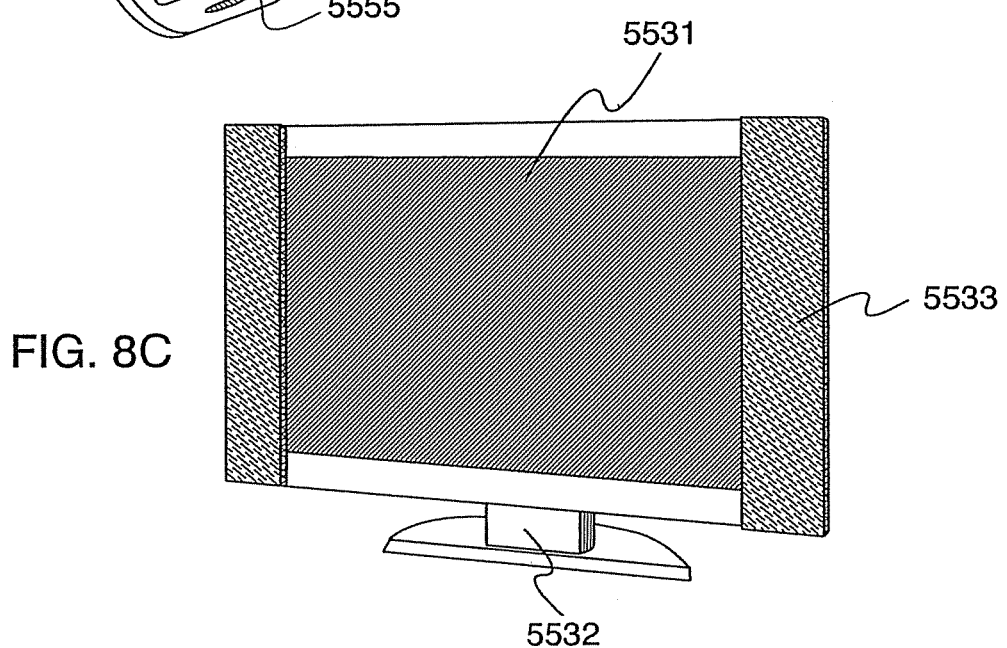

Examples of electronic appliances mounted with the light emitting devices of the present invention are illustrated in FIGS. 8A to 8C.

FIG. 8A is a laptop personal computer manufactured in accordance with the invention, including a main body 5521, a housing 5522, a display portion 5523, a keyboard 5524 and the like. The laptop personal computer can be achieved by incorporating the light emitting device including the light emitting element of the invention thereinto.

FIG. 8B is a telephone set manufactured according to the invention, including a main body 5552, a display portion 5551, an audio output portion 5554, an audio input portion 5555, operation switches 5556 and 5557, an antenna 5553 and the like. The telephone set can be achieved by incorporating the light emitting device including the light emitting element of the invention thereinto.

FIG. 8C is a television set manufactured according to the invention, including a display portion 5531, a housing 5532, speakers 5533 and the like. The television set can be achieved by incorporating the light emitting device including the light emitting element of the invention thereinto.

As set forth above, the light emitting devices of the invention are suitable to be used as the display portions for various kinds of electronic appliances.

Further, the light emitting devices having the light emitting elements of the invention may be mounted on a navigation device, a lighting device, and the like, in addition to the electronic appliances as mentioned above.

Embodiment Mode 6

One embodiment mode of a method for synthesizing a quinoxaline derivative expressed by the general formula 1 will be described.

A compound that includes o-phenylenediamine in its skeleton reacts with 4,4'-dibromobenzyl to synthesize a compound A that contains 2,3-bis(4-bromophenyl)quinoxaline in its skeleton. Thereafter, diarylamine such as diphenylamine and N-(1-naphthyl)-N-phenylamine reacts with the compound A to substitute a diarylamino group for a bromo group. Thus, the quinoxaline derivative as expressed by the general formula 1 can be obtained.

Embodiment Mode 7

One embodiment mode of a method for synthesizing the quinoxaline derivative as expressed by the general formula 2 will be described.

Firstly, 3,3'-diaminobenzine or the like reacts with 4,4'-dibromobenzyl to synthesize 2,2',3,3'-tetra(4-bromophenyl)-6,6'-bisquinoxaline (a compound B) that contains 2,3-bis(4-bromophenyl)quinoxaline in its skeleton. Thereafter, the diarylamine reacts with the compound B to substitute a diarylamino group for a bromo group. Thus, the quinoxaline derivative as expressed by the general formula 2 can be obtained.

EMBODIMENTS

Embodiment 1

Figure 2:
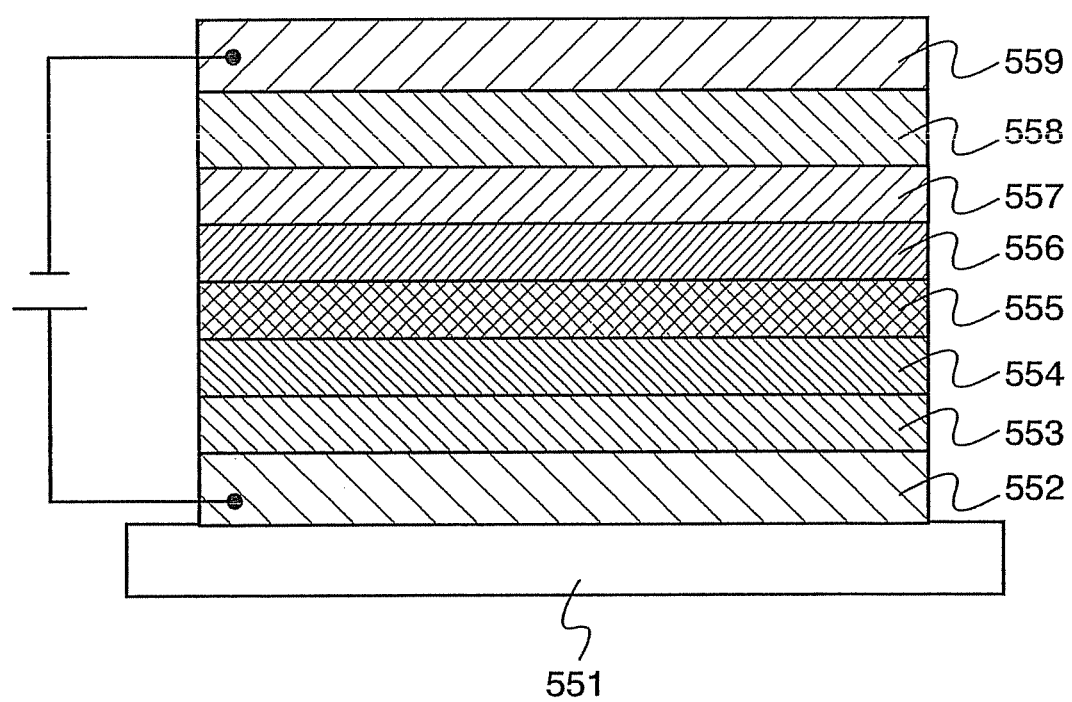
FIG. 2 is a cross sectional view showing a laminated structure of a light emitting element in accordance with the invention.

Methods for manufacturing three light emitting elements (i.e., a light emitting element 1, a light emitting element 2 and a light emitting element 3), and characteristics of these elements will be described in this embodiment with reference to FIG. 2.

Indium tin oxide containing silicon was formed over a substrate 551 by sputtering to form a second electrode 552. The second electrode 552 was formed to have a thickness of 110 nm. Further, a substrate made of glass was used as the substrate 551.

Next, a layer 553 including molybdenum oxide and TPAQn was formed on the second electrode 552 by co-evaporation of the molybdenum oxide and the TPAQn. With respect to the light emitting element 1, the molybdenum oxide-TPAQn mass ratio (i.e., molybdenum oxide:TPAQn) was adjusted to satisfy 0.5:4. With respect to the light emitting element 2, the molybdenum oxide-TPAQn mass ratio (i.e., molybdenum oxide:TPAQn) was adjusted to satisfy 1:4. With respect to the light emitting element 3, the molybdenum oxide-TPAQn mass ratio (i.e., molybdenum oxide:TPAQn) was adjusted to satisfy 2:4. The thickness of the layer 553 for each light emitting element was set to be 50 nm.

Next, a layer 554 including 4,4'-bis[N-(1-naphthyl)-N-phenylamino]biphenyl (abbreviation: NPB or α-NPD) was formed on the layer 553 by vacuum evaporation of the NPB. The layer 554 was formed to have a thickness of 10 nm.

A layer 555 including tris(8-quinolinolato) aluminum (abbreviation: $Alq_3$) and coumarin 6 was formed on the layer 554 by co-evaporation of the $Alq_3$ and the coumarin 6. The $Alq_3$-coumarin 6 mass ratio was adjusted to satisfy 1:0.01. Accordingly, the coumarin 6 was dispersed in the $Alq_3$. The thickness of the layer 555 was set to be 40 nm. Further, the co-evaporation is an evaporation method that is performed simultaneously from plural evaporation sources provided in one treatment chamber.

Next, a layer 556 including $Alq_3$ was formed on the layer 555 by vacuum evaporation of the $Alq_3$. The thickness of the layer 556 was set to be 10 nm.

Next, a second layer 557 including TPAQn and lithium (Li) was formed on the layer 556 by co-evaporation of the TPAQn and the lithium. The TPAQn-lithium mass ratio (i.e., TPAQn:Li) was adjusted to satisfy 1:0.01 so that the molar ratio between TPAQn and lithium (i.e., TPAQn/Li) was 1. The thickness of the second layer 557 was set to be 10 nm.

Subsequently, a first layer 558 including TPAQn and molybdenum oxide (VI) was formed on the second layer 557 by co-evaporation of the TPAQn and the molybdenum oxide. The TPAQn-molybdenum oxide mass ratio (i.e., TPAQn:molybdenum oxide) was set to be 4:2 so that the molar ratio between the TPAQn and the molybdenum oxide (i.e., TPAQn/molybdenum oxide) was 0.5. The thickness of the first layer 558 was set to be 10 nm.

Next, a first electrode 559 was formed on the first layer 558 by vacuum evaporation of aluminum. The thickness of the first electrode was set to be 200 nm.

As set forth above, the light emitting elements of the present invention were manufactured. In each light emitting element, the first layer 558 was formed after forming the second layer 557 in this embodiment. When a bipolar substance included in the first layer 558 is the same as the one included in the second layer 557, evaporation sources for the bipolar substance, a substance exhibiting an electron accepting ability with respect to the bipolar substance and a substance exhibiting an electron donating ability with respect to the bipolar substance are provided in one treatment chamber, respectively, and the first and second layers 558 and 557 may be formed successively. Concretely, an evaporation source for TPAQn and an evaporation source for lithium and an evaporation source for molybdenum oxide are provided in the one treatment chamber, and the TPAQn and the lithium are evaporated together. While maintaining a condition where the TPAQn can be evaporated, evaporation of the lithium is terminated and then evaporation of the molybdenum oxide starts. The first and second layers 558 and 557 can be sequentially formed in such a manner. Further, the layers containing the bipolar substance that are formed successively are equivalent to one layer including a first region that contains a substance exhibiting an electron accepting ability with respect to the bipolar substance and a second region that contains a substance exhibiting an electron donating ability with respect to the bipolar substance. Moreover, the first region generates holes while the second region generates electrons.

When current flows through each light emitting element manufactured above by applying the voltage thereto such that a potential of the second electrode 552 is higher than that of the first electrode 559, holes generated in the first layer 558 are injected in the first electrode 559 while electrons generated in the second layer 557 are injected in the layer 556. The holes are injected in the layer 553 from the second electrode 552. The holes injected from the second electrode 552 and the electrons injected from the second layer 557 are recombined in the layer 555, allowing the coumarin 6 to emit light. Accordingly, the layer 555 serves as a light emitting layer. Further, the layer 553 serves as a hole injecting layer. The layer 554 serves as a hole transporting layer. The layer 556 serves as an electron transporting layer. Further, the electron affinity of $Alq_3$ included in the layer 556 is 2.62 eV, and the electron affinity of TPAQn included in the second layer 557 is 2.78 eV. The difference in electron affinity between the $Alq_3$ and TPAQn is 0.16 eV.

Figure 9:
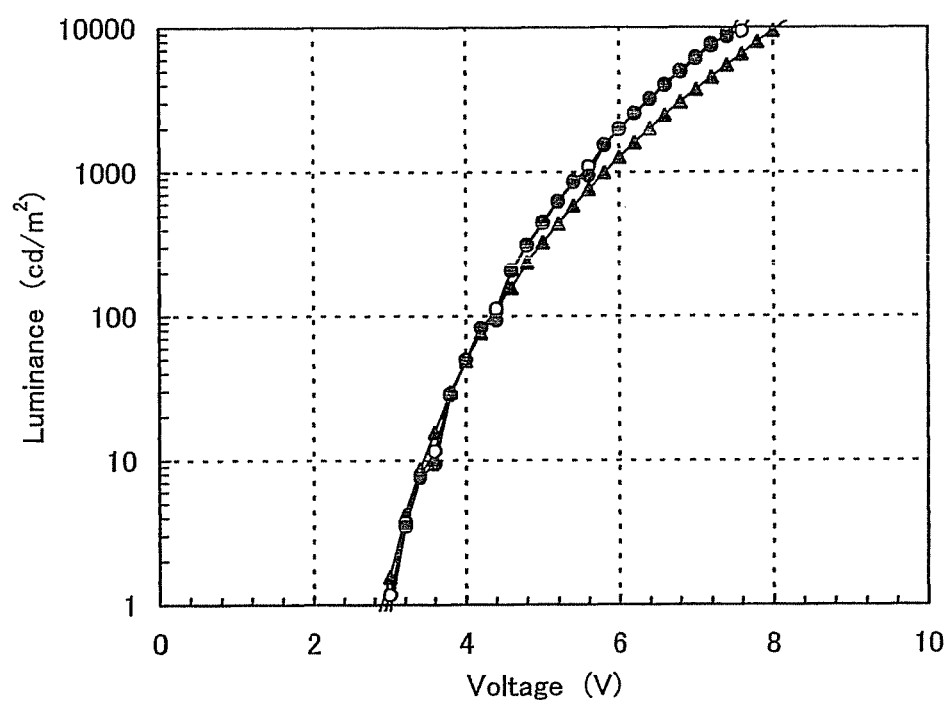
FIG. 9 is a graph showing voltage-luminance characteristics of light emitting elements of the invention.
Figure 10:
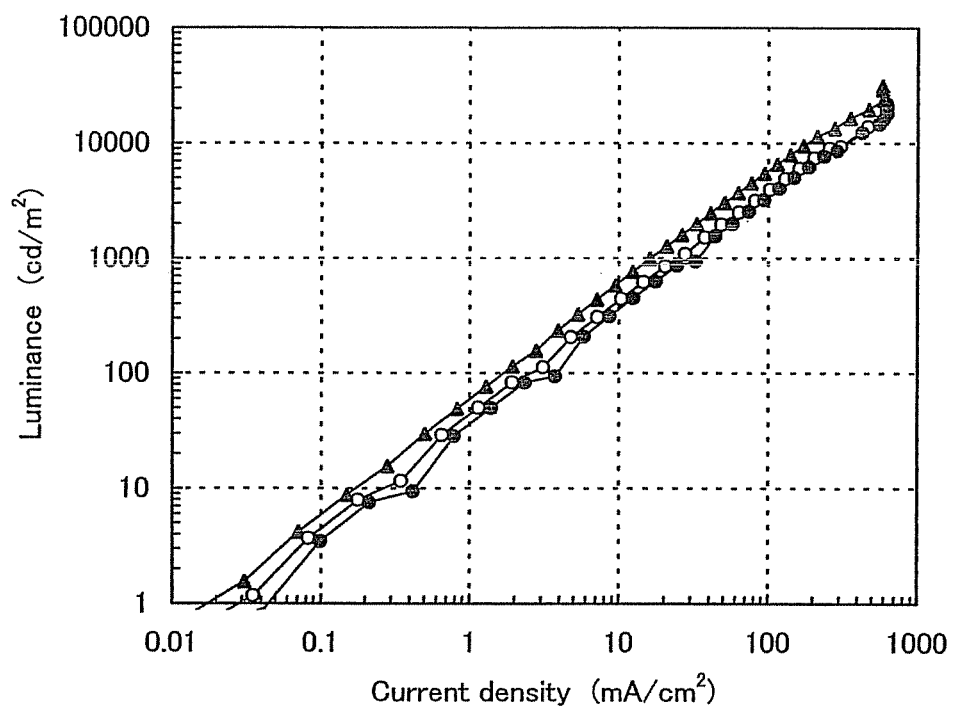
FIG. 10 is a graph showing current density-luminance characteristics of the light emitting elements of the invention.
Figure 11:
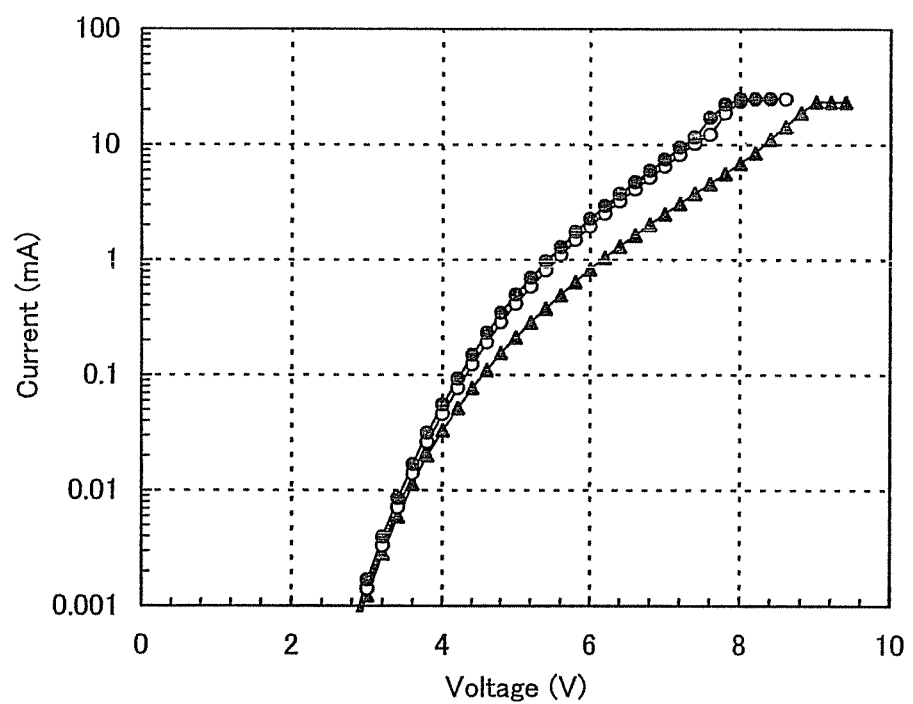
FIG. 11 is a graph showing voltage-current characteristics of the light emitting elements of the invention.

FIG. 9 shows the voltage-luminance characteristics of the light emitting elements of the present embodiment, FIG. 10 shows the current density-luminance characteristics thereof, and FIG. 11 shows the voltage-current characteristics thereof. In FIG. 9, a horizontal axis represents the voltage (V) while a perpendicular axis represents the luminance ($cd/m^2$). In FIG. 10, a horizontal axis represents the current density ($mA/cm^2$) while a perpendicular axis represents the luminance ($cd/m^2$). In FIG. 11, a horizontal axis represents the voltage (V) while a perpendicular axis represents the current (mA). In FIGS. 9, 10 and 11, curves marked by closed triangles (▲) indicates the characteristics of the light emitting element 1, curves marked by open circles (○) indicates the characteristics of the light emitting element 2, and curves marked by closed circles (•) indicates the characteristics of the light emitting element 3.

It is known that respective light emitting elements are operated favorably from FIGS. 9, 10 and 11.

Embodiment 2

A method for manufacturing TPAQn used in Embodiment 1 will be described.

[Step 1]

Firstly, 10 g (27.4 mmol) of 4,4'-dibromobenzyl and 3.5 g (33.5 mmol) of o-phenylenediamine were poured in an eggplant-type flask, and then agitation and reflux were carried out for 8 hours under chloroform. Next, after cooling the mixture to room temperature, the residue of the o-phenylenediamine was removed by column chromatography to obtain 2,3-bis(4-bromophenyl)quinoxaline.

[Step 2]

Further, 4.40 g (10.0 mmol) of the thus-obtained 2,3-bis(4-bromophenyl) quinoxaline was poured in a three-neck flask and dissolved in 75 ml of toluene under nitrogen airflow. Next, 0.22 g (0.2 mmol) of Pd $(dba)_2$, 2.88 g (30 mmol) of NaO-tert-Bu and 3.46 g (20.4 mmol) of diphenylamine were added to the solution in the flask. In addition, 1.8 ml of hexane solution including 10 wt % of tri(tert-butylphosphine) was added to the mixture and the mixture was agitated at a temperature of 80° C. for 8 hours.

Next, the mixture was cooled to the room temperature, and then water was added to the mixture to terminate the reaction. Thereafter, a product was extracted using chloroform. Furthermore, after washing the product with saturated saline, it was dried with $MgSO_4$. Afterwards, recrystallization was performed from chloroform to obtain 2,3-bis(4-diphenylaminophenyl)quinoxaline (abbreviation: TPAQn) (a yellow-green crystal, yield point: 2.7 g (yield constant: 44%)).

A synthesis scheme of the above described synthesis is shown below.

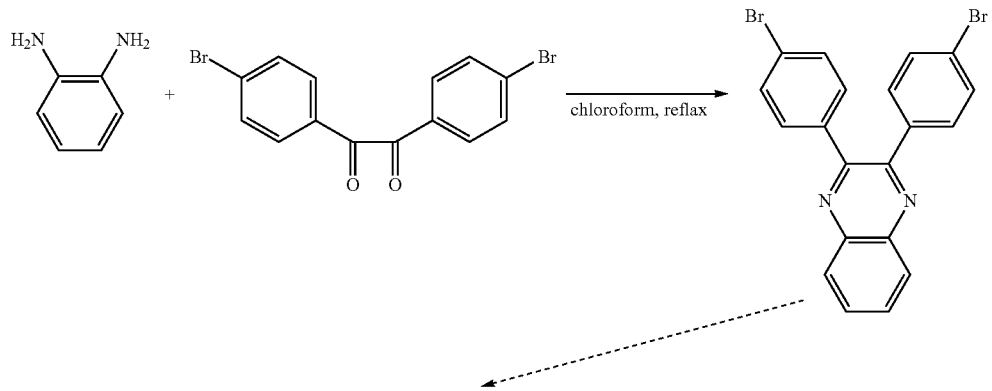

-continued

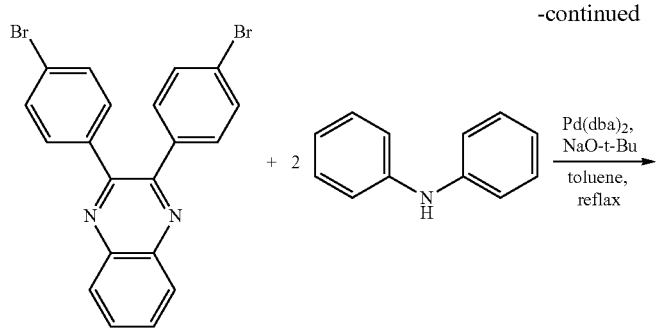 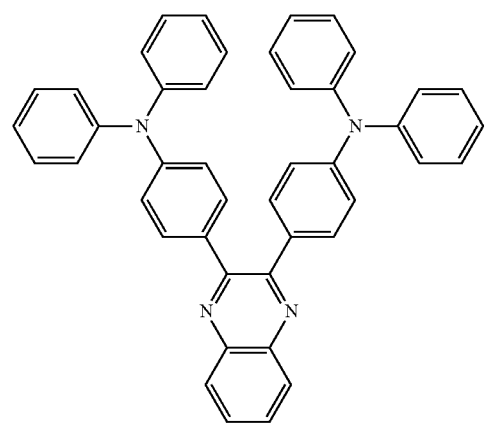

Further, the degradation temperature of the thus obtained TPAQn was 411° C. Furthermore, the measurement was performed using a thermo-gravimetric/differential thermal analyzer (Model TG/DTA 320, Seiko Instruments Inc.).

A layer including indium tin oxide was formed over a substrate to have a thickness of 110 nm, and a layer including TPAQn with a thickness of 800 nm was formed thereon. Also, a layer including aluminum with a thickness of 200 nm was formed on the layer including TPAQn. Thereafter, the hole mobility and the electron mobility of the TPAQn were measured using a time-of-flight (TOF) technique, respectively. As a result, it was known that the hole mobility was $1\times10^{-6}$ cm$^2$/Vs and the electron mobility was $1\times10^{-5}$ cm$^2$/Vs.

The invention claimed is:

1. A light emitting element comprising:
a first layer;
a second layer; and
a third layer,
wherein the first layer, the second layer, and the third layer are interposed between a first electrode and a second electrode,
wherein the first layer contains a first substance of which a ratio of any one of an electron mobility and a hole mobility to the other one is 100 or less, and a second substance exhibiting an electron accepting ability with respect to the first substance,
wherein the second layer contains a third substance of which a ratio of any one of an electron mobility and a hole mobility to the other one is 100 or less, and a fourth substance exhibiting an electron donating ability with respect to the third substance,
wherein the third layer contains a light emitting substance,
wherein the second layer is interposed between the first layer and the third layer, and
wherein the first layer is in direct contact with the second layer.

2. A light emitting element comprising:
a first layer;
a second layer; and
a third layer,
wherein the first layer, the second layer, and the third layer are interposed between a first electrode and a second electrode,
wherein the first electrode is formed using a conductive material having a reflectance of 50% or more and 100% or less,
wherein the second electrode is formed using a conductive material that can transmit visible light,
wherein the first layer contains a first substance of which a ratio of any one of an electron mobility and a hole mobility to the other one is 100 or less, and a second substance exhibiting an electron accepting ability with respect to the first substance,
wherein the second layer contains a third substance of which any one of an electron mobility and a hole mobility to the other one is 100 or less, and a fourth substance exhibiting an electron donating ability with respect to the third substance,
wherein the third layer contains a light emitting layer and includes x pieces of layers, x being a positive integer,
wherein the first layer, the second layer, and the third layer are sequentially laminated,
wherein the first layer is in contact with the first electrode,
wherein the first layer is in direct contact with the second layer,
wherein one layer included in the third layer is in contact with the second layer,
wherein the x-th piece of layer included in the third layer is in contact with the second electrode,
wherein y pieces of layers are interposed between the light emitting layer and the second layer, y being a positive integer smaller than x,
wherein a thickness of the first layer and a thickness of the second layer are adjusted to satisfy an expression 1, an expression 2 and an expression 3:

$$n_i d_i + n_{ii} d_{ii} + \sum_{k=1}^{y} n_k d_k + n_j d_j = \frac{(2m-1)\lambda}{4} \quad \text{[Expression 1]}$$

$$0 \leq d_j \leq d_{emi} \quad \text{[Expression 2]}$$

$$d_i \geq d_{ii} \quad \text{[Expression 3]}$$

wherein, $n_i$ represents a refractive index of the first layer; $d_i$, a thickness of the first layer; a refractive index of the second layer; $d_{ii}$, a thickness of the second layer; $n_k$, a refractive index of a k-th layer of the layers between the light emitting layer and the second layer, k being a natural number; $d_k$, a thickness of the k-th layer of the layers between the light emitting layer and the second layer; $n_j$, a refractive index of the light emitting layer; $d_j$, a distance from an interface between the light emitting layer and the first electrode to a light emitting region; λ, a wavelength of light emission from the light emitting element; m, a positive integer; and $d_{emi}$, a thickness of the light emitting layer.

3. A light emitting element comprising:
a first layer containing a first substance of which a ratio of any one of an electron mobility and a hole mobility to the other one is 100 or less; and
a second layer containing a light emitting substance,
wherein the first layer and the second layer are interposed between a first electrode and a second electrode, and
wherein the first layer includes a first region containing a second substance that exhibits an electron accepting ability with respect to the first substance, and a second region containing a third substance that exhibits an electron donating ability with respect to the first substance.

4. The light emitting element according to claim 1, the third layer comprising an electron transporting layer and a light emitting layer,
wherein the first electrode, the first layer, the second layer, the electron transporting layer, and the light emitting layer are laminated in this order without an additional layer intercalated therebetween,
wherein a thickness of the first layer and a thickness of the second layer are adjusted to satisfy an expression 6:

$$\frac{(2m-1)\lambda}{4} - n_{ii}d_{ii} - n_1 d_1 - n_p d_p \leq \qquad [\text{Expression 6}]$$

$$n_i d_i \leq \frac{(2m-1)\lambda}{4} - n_{ii}d_{ii} - n_1 d_1$$

wherein $n_i$ represents a refractive index of the first layer; $d_i$, a thickness of the first layer; $n_{ii}$, a refractive index of the second layer; $d_{ii}$, a thickness of the second layer; $n_1$, a refractive index of the electron transporting layer; $d_1$, a thickness of the electron transporting layer; $n_p$, a refractive index of the light emitting layer; $d_p$, a thickness of the light emitting layer; λ, a wavelength of light generated in the light emitting element; and m, a positive integer.

5. The light emitting element according to claim 3, the second layer comprising an electron transporting layer and a light emitting layer,
wherein the first electrode, the first layer, the electron transporting layer, and the light emitting layer are laminated in this order without an additional layer intercalated therebetween,
wherein the first region and the second region overlap each other,
wherein a thickness of the first region and a thickness of the second region are adjusted to satisfy an expression 6:

$$\frac{(2m-1)\lambda}{4} - n_{ii}d_{ii} - n_1 d_1 - n_p d_p \leq \qquad [\text{Expression 6}]$$

$$n_i d_i \leq \frac{(2m-1)\lambda}{4} - n_{ii}d_{ii} - n_1 d_1$$

wherein $n_i$ represents a refractive index of the first region; $d_i$, a thickness of the first region; $n_{ii}$, a refractive index of the second region; $d_{ii}$, a thickness of the second region; $n_1$, a refractive index of the electron transporting layer; $d_1$, a thickness of the electron transporting layer; $n_p$, a refractive index of the light emitting layer; $d_p$, a thickness of the light emitting layer; λ, a wavelength of light generated in the light emitting element; and m, a positive integer.

6. The light emitting element according to claim 1,
wherein the first layer contains the second substance such that a molar ratio of the second substance to the first substance is 0.5 or more and 2 or less.

7. The light emitting element according to claim 2,
wherein the first layer contains the second substance such that a molar ratio of the second substance to the first substance is 0.5 or more and 2 or less.

8. The light emitting element according to claim 3,
wherein the first layer contains the second substance and the third substance such that a molar ratio of the second substance or the third substance to the first substance is 0.5 to 2.

9. A light emitting element according to claim 1, wherein the first substance is identical to the third substance.

10. A light emitting element according to claim 2, wherein the first substance is identical to the third substance.

11. The light emitting element according to claim 1,
wherein the first layer is provided to be closer to the first electrode than the second layer,
wherein the third layer is provided to be closer to the second electrode than the second layer,
wherein the light emitting element is configured to emit light when a voltage applied to the light emitting element is such that a potential of the second electrode is higher than that of the first electrode.

12. The light emitting element according to claim 2,
wherein the first layer is provided to be closer to the first electrode than the second layer,
wherein the third layer is provided to be closer to the second electrode than the second layer,
wherein the light emitting element is configured to emit light when a voltage applied to the light emitting element is such that a potential of the second electrode is higher than that of the first electrode.

13. The light emitting element according to claim 3,
wherein the first region is provided to be closer to the first electrode than the second region, and
wherein the light emitting element is configured to emit light when a voltage applied to the light emitting element is such that a potential of the second electrode is higher than that of the first electrode.

14. A light emitting element according to claim 11,
wherein the first layer is in direct contact with the first electrode.

15. A light emitting element according to claim 12,
wherein the first layer is in direct contact with the first electrode.

16. A light emitting element according to claim 13,
wherein the first layer is in direct contact with the first electrode.

17. A light emitting element according to claim 11,
wherein the third layer is in direct contact with the second electrode.

18. A light emitting element according to claim 12,
wherein the third layer is in direct contact with the second electrode.

19. A light emitting element according to claim 13,
wherein the second layer is in direct contact with the second electrode.

20. An electronic appliance including a display portion comprising the light emitting element according to claim 1.

21. An electronic appliance including a display portion comprising the light emitting element according to claim 2.

22. An electronic appliance including a display portion comprising the light emitting element according to claim 3.

* * * * *